United States Patent
Park et al.

(10) Patent No.: US 12,007,584 B2
(45) Date of Patent: Jun. 11, 2024

(54) IMAGE SENSOR INCLUDING COLOR SEPARATING LENS ARRAY AND ELECTRONIC APPARATUS INCLUDING THE IMAGE SENSOR

(71) Applicant: SAMSUNG ELECTRONICS CO., LTD., Suwon-si (KR)

(72) Inventors: Hongkyu Park, Yongin-si (KR); Seokho Yun, Seoul (KR); Minwoo Lim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 50 days.

(21) Appl. No.: 17/514,780

(22) Filed: Oct. 29, 2021

(65) Prior Publication Data

US 2022/0137267 A1    May 5, 2022

(30) Foreign Application Priority Data

Oct. 30, 2020  (KR) .......................... 10-2020-0143875
Jun. 25, 2021  (KR) .......................... 10-2021-0083125

(51) Int. Cl.
*G02B 3/00* (2006.01)
*G02B 1/115* (2015.01)
(Continued)

(52) U.S. Cl.
CPC ............ *G02B 3/0006* (2013.01); *G02B 1/115* (2013.01); *H04N 23/60* (2023.01); *H04N 25/11* (2023.01)

(58) Field of Classification Search
CPC ...... G02B 3/0006; G02B 1/115; H04N 23/60; H04N 25/11; H04N 25/75; H04N 25/79;
(Continued)

(56) References Cited

U.S. PATENT DOCUMENTS 5,561,009 A * 10/1996 Mohri ..................... G03F 1/30
                                                    428/209
10,199,415 B2    2/2019 Akselrod et al.
(Continued)

FOREIGN PATENT DOCUMENTS

CN      106483594 A      3/2017
CN      108419190 A      8/2018
(Continued)

OTHER PUBLICATIONS

Communication dated Mar. 23, 2022 issued by the European Patent Office in European Application No. 21205263.3.

*Primary Examiner* — Sinh Tran
*Assistant Examiner* — Tuan H Le
(74) *Attorney, Agent, or Firm* — Sughrue Mion, PLLC

(57) ABSTRACT

Provided is an image sensor including a color separating lens array. The image sensor includes: a sensor substrate including a first pixel configured to sense light of a first wavelength and a second pixel configured to sense light of a second wavelength; a transparent spacer layer on the sensor substrate; and a color separating lens array on the spacer layer, wherein the color separating lens array condenses the light of the first wavelength toward the first pixel, and includes a first lens layer on the spacer layer, a second lens layer on the first lens layer, and an etch prevention layer between the first lens layer and the second lens layer.

26 Claims, 47 Drawing Sheets

(51) Int. Cl.
*H04N 23/60* (2023.01)
*H04N 25/11* (2023.01)

(58) Field of Classification Search
CPC .. H04N 25/76; H04N 25/77; H01L 27/14621; H01L 27/14627; H01L 27/14645; H01L 27/14683; H01L 27/14685
See application file for complete search history.

(56) References Cited

U.S. PATENT DOCUMENTS

| | | |
|---|---|---|
| 2008/0173793 A1 | 7/2008 | Mokhnatyuk |
| 2017/0090206 A1* | 3/2017 | Kim .................. H01L 27/14627 |
| 2017/0097510 A1 | 4/2017 | Sohn |
| 2020/0098814 A1 | 3/2020 | Yang |
| 2020/0103339 A1* | 4/2020 | Castagna ........... G01N 21/3504 |
| 2021/0124179 A1 | 4/2021 | Yun et al. |
| 2021/0126029 A1 | 4/2021 | Roh et al. |
| 2021/0126030 A1 | 4/2021 | Yun et al. |
| 2021/0249459 A1 | 8/2021 | Yun et al. |
| 2022/0085088 A1 | 3/2022 | Toda |

FOREIGN PATENT DOCUMENTS

| | | |
|---|---|---|
| EP | 3 151 056 A1 | 4/2017 |
| KR | 10-1772968 B1 | 8/2017 |
| KR | 10-2018-0131175 A | 12/2018 |
| KR | 10-2021-0048400 A | 5/2021 |
| KR | 10-2021-0048985 A | 5/2021 |
| KR | 10-2021-0102026 A | 8/2021 |
| WO | 2020/144971 A1 | 7/2020 |

* cited by examiner

FIG. 2B

| C | M | C | M | C | M | C | M |
|---|---|---|---|---|---|---|---|
| Y | G | Y | G | Y | G | Y | G |
| C | M | C | M | C | M | C | M |
| Y | G | Y | G | Y | G | Y | G |
| C | M | C | M | C | M | C | M |
| Y | G | Y | G | Y | G | Y | G |
| C | M | C | M | C | M | C | M |
| Y | G | Y | G | Y | G | Y | G |

FIG. 2C

| R | G | R | G | R | G | R | G |
|---|---|---|---|---|---|---|---|
| B | W | B | W | B | W | B | W |
| R | G | R | G | R | G | R | G |
| B | W | B | W | B | W | B | W |
| R | G | R | G | R | G | R | G |
| B | W | B | W | B | W | B | W |
| R | G | R | G | R | G | R | G |
| B | W | B | W | B | W | B | W |

[Security]

IMAGE SENSOR INCLUDING COLOR SEPARATING LENS ARRAY AND ELECTRONIC APPARATUS INCLUDING THE IMAGE SENSOR

CROSS-REFERENCE TO RELATED APPLICATIONS

This application is based on and claims priority under 35 U.S.C. § 119 to Korean Patent Application No. 10-2020-0143875, filed on Oct. 30, 2020, and Korean Patent Application No. 10-2021-0083125, filed on Jun. 25, 2021, in the Korean Intellectual Property Office, the disclosures of which are incorporated by reference herein in their entirety.

BACKGROUND

1. Field

The disclosure relates to an image sensor including a color separating lens array capable of focusing incident light separately according to wavelengths of the incident light, and an electronic apparatus including the image sensor.

2. Description of the Related Art

Image sensors generally sense the color of incident light by using a color filter. However, a color filter may have low light utilization efficiency because the color filter absorbs light of colors other than the corresponding color of light of the color filter. For example, when an RGB color filter is used, only ⅓ of the incident light is transmitted and the rest, that is, ⅔ of the incident light, is absorbed. Thus, light utilization efficiency is only about 33%. Thus, in a color display apparatus or a color image sensor, most light loss occurs in the color filter.

SUMMARY

Provided are an image sensor having improved light utilization efficiency and color reproductivity by using a color separating lens array capable of focusing incident light separately according to wavelengths of the incident light, and an electronic apparatus including the image sensor.

Additional aspects will be set forth in part in the description which follows and, in part, will be apparent from the description, or may be learned by practice of the presented embodiments of the disclosure.

According to an aspect of an example embodiment, provided is an image sensor including: a sensor substrate including a first pixel, configured to sense light of a first wavelength, and a second pixel configured to sense light of a second wavelength; a spacer layer on the sensor substrate, the spacer layer being transparent; and a color separating lens array on the spacer layer, the color separating lens array being configured to condense the light of the first wavelength incident on the color separating lens array toward the first pixel, wherein the color separating lens array includes a first lens layer on the spacer layer, a second lens layer on the first lens layer, and a first etch prevention layer between the first lens layer and the second lens layer.

According to an aspect of an example embodiment, provided is a method of manufacturing an image sensor, the method including: forming a spacer layer on a sensor substrate, the sensor substrate including a first pixel, configured to sense light of a first wavelength, and a second pixel configured to sense light of a second wavelength; forming a first lens layer on the spacer layer; forming a first etch prevention layer on the first lens layer; forming a first dielectric layer on the first etch prevention layer; forming an engraved pattern in the first dielectric layer; and forming a second lens layer by filling a first high-refractive material in the engraved pattern.

According to an aspect of an example embodiment, provided is an electronic apparatus including: an image sensor configured to convert an optical image into an electrical signal; and a processor configured to control operations of the image sensor and store and output a signal generated by the image sensor, wherein the image sensor includes: a sensor substrate including a first pixel, configured to sense light of a first wavelength, and a second pixel configured to sense light of a second wavelength; a spacer layer on the sensor substrate, the spacer layer being transparent; and a color separating lens array on the spacer layer, the color separating lens array being configured to condense the light of the first wavelength incident on the color separating lens array toward the first pixel, and wherein the color separating lens array includes a first lens layer on the spacer layer, a second lens layer on the first lens layer, and a first etch prevention layer between the first lens layer and the second lens layer.

BRIEF DESCRIPTION OF THE DRAWINGS

The above and other aspects, features, and advantages of certain embodiments of the disclosure will be more apparent from the following description taken in conjunction with the accompanying drawings, in which:

FIGS. 2A to 2C are diagrams showing examples of various pixel arrangements in a pixel array of an image sensor;

DETAILED DESCRIPTION

Figure 1:
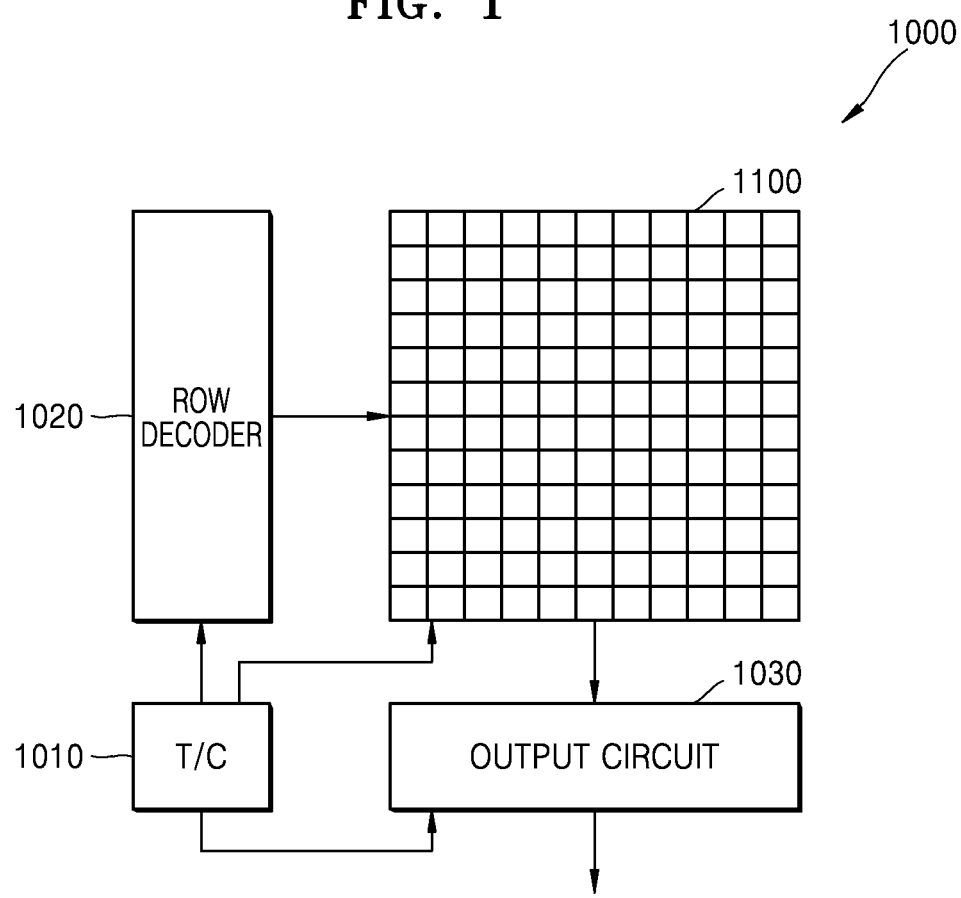
FIG. 1 is a block diagram of an image sensor according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, an image sensor including a color separating lens array and an electronic apparatus including the image sensor will be described in detail with reference to accompanying drawings. The embodiments of the disclosure are capable of various modifications and may be embodied in many different forms. In the drawings, like reference numerals denote like components, and sizes of components in the drawings may be exaggerated for convenience of explanation.

When a layer, a film, a region, or a panel is referred to as being "on" another element, it may be directly on/under/at left/right sides of the other layer or substrate, or intervening layers may also be present.

It will be understood that although the terms "first," "second," etc. may be used herein to describe various components, these components should not be limited by these terms. These components are only used to distinguish one component from another. These terms do not limit that materials or structures of components are different from one another.

An expression used in the singular encompasses the expression of the plural, unless it has a clearly different meaning in the context. It will be further understood that when a portion is referred to as "comprises" another component, the portion may not exclude another component but may further comprise another component unless the context states otherwise.

In addition, the terms such as " . . . unit", "module", etc. provided herein indicates a unit performing at least one function or operation, and may be realized by hardware, software, or a combination of hardware and software.

The use of the terms of "the above-described" and similar indicative terms may correspond to both the singular forms and the plural forms.

Also, the steps of all methods described herein may be performed in any suitable order unless otherwise indicated herein or otherwise clearly contradicted by context. Also, the use of all exemplary terms (for example, etc.) is only to describe a technical spirit in detail, and the scope of rights is not limited by these terms unless the context is limited by the claims.

FIG. 1 is a block diagram of an image sensor 1000 according to an embodiment. Referring to FIG. 1, the image sensor 1000 may include a pixel array 1100, a timing controller 1010, a row decoder 1020, and an output circuit 1030. The image sensor 1000 may include a charge-coupled device (CCD) image sensor or a complementary metal oxide semiconductor (CMOS) image sensor.

The pixel array 1100 includes pixels that are two-dimensionally arranged in a plurality of rows and columns. The row decoder 1020 selects one of the rows in the pixel array 1100 in response to a row address signal output from the timing controller 1010. The output circuit 1030 outputs a photosensitive signal, in a column unit, from a plurality of pixels arranged in the selected row. To this end, the output circuit 1030 may include a column decoder and an analog-to-digital converter (ADC). For example, the output circuit 1030 may include a column decoder and a plurality of ADCs arranged corresponding to respective columns in the pixel array 1100 or one ADC arranged at an output end of the column decoder. The timing controller 1010, the row decoder 1020, and the output circuit 1030 may be implemented as one chip or in separate chips. A processor for processing an image signal output from the output circuit 1030 may be implemented as one chip with the timing controller 1010, the row decoder 1020, and the output circuit 1030.

The pixel array 1100 may include a plurality of pixels that sense light of different wavelengths. The pixel arrangement may be implemented in various ways. For example, FIGS. 2A to 2C show various pixel arrangements in the pixel array 1100 of the image sensor 1000.

Figure 2A:
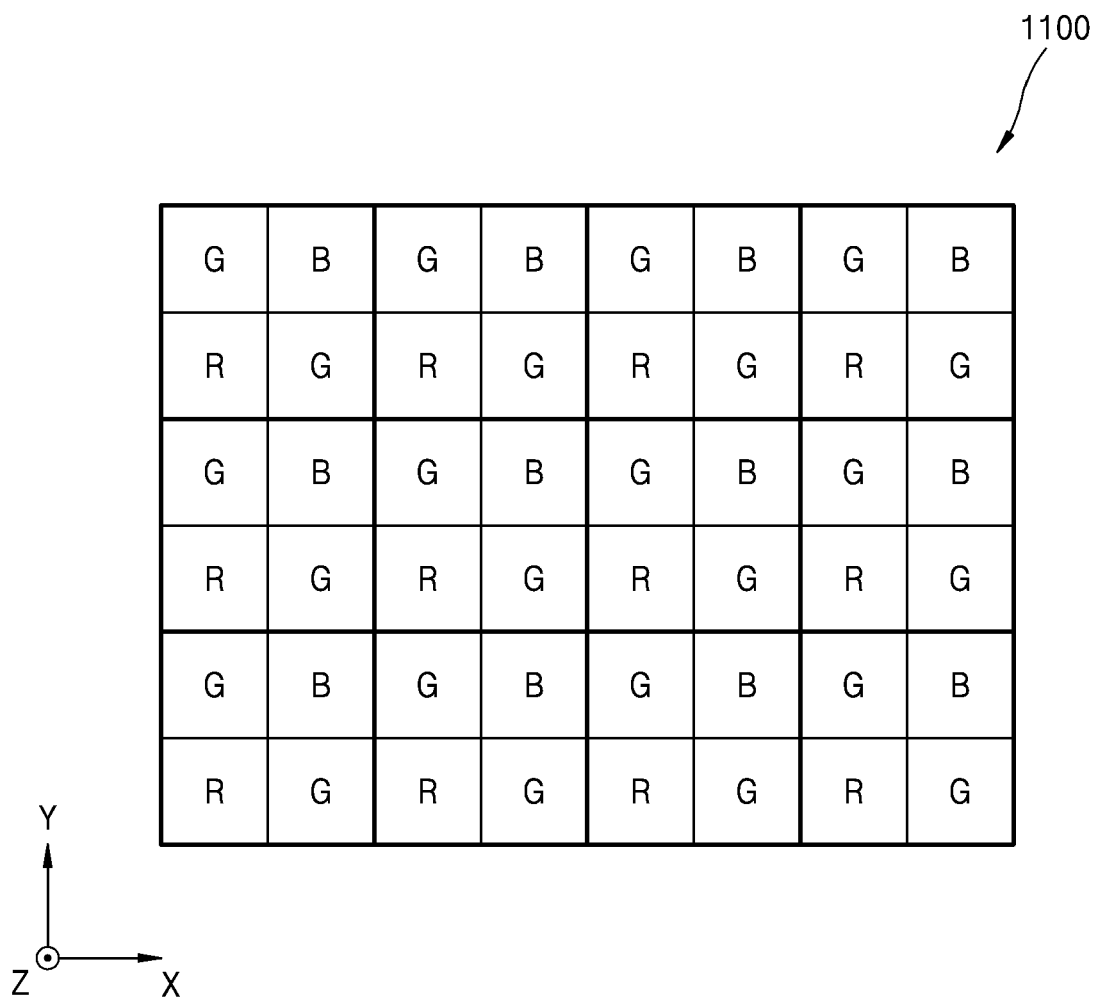

FIG. 2A shows a Bayer pattern that is generally adopted in the image sensor 1000. Referring to FIG. 2A, one unit pattern includes four quadrant regions, and first through fourth quadrants may be a blue pixel B, a green pixel G, a red pixel R, and another green pixel G, respectively. The unit patterns may be repeatedly and two-dimensionally arranged in a first direction (e.g., X direction) and a second direction (e.g., Y direction). In other words, two green pixels G are arranged in one diagonal direction and one blue pixel B and one red pixel R are arranged in another diagonal direction in a unit pattern of a 2×2 array. In the entire arrangement of pixels, a first row in which a plurality of green pixels G and a plurality of blue pixels B are alternately arranged in the first direction and a second row in which a plurality of red pixels R and a plurality of green pixels G are alternately arranged in the first direction are repeatedly arranged in a second direction.

The pixel array 1100 may be arranged in various arrangement patterns, rather than the Bayer pattern. For example, referring to FIG. 2B, a CYGM arrangement, in which a magenta pixel M, a cyan pixel C, a yellow pixel Y, and a green pixel G configure one unit pattern, may be used. Also, referring to FIG. 2C, an RGBW arrangement, in which a green pixel G, a red pixel R, a blue pixel B, and a white pixel W configure one unit pattern, may be used. Although not shown in the drawings, the unit pattern may have a 3×2 array form. In addition to the above examples, the pixels in the pixel array 1100 may be arranged in various ways according to color characteristics of the image sensor 1000. Hereinafter, it will be described that the pixel array 1100 of the image sensor 1000 has the Bayer pattern, but the operating principles of the disclosure may be applied to other patterns of pixel arrangements than the Bayer pattern.

Figure 3A:
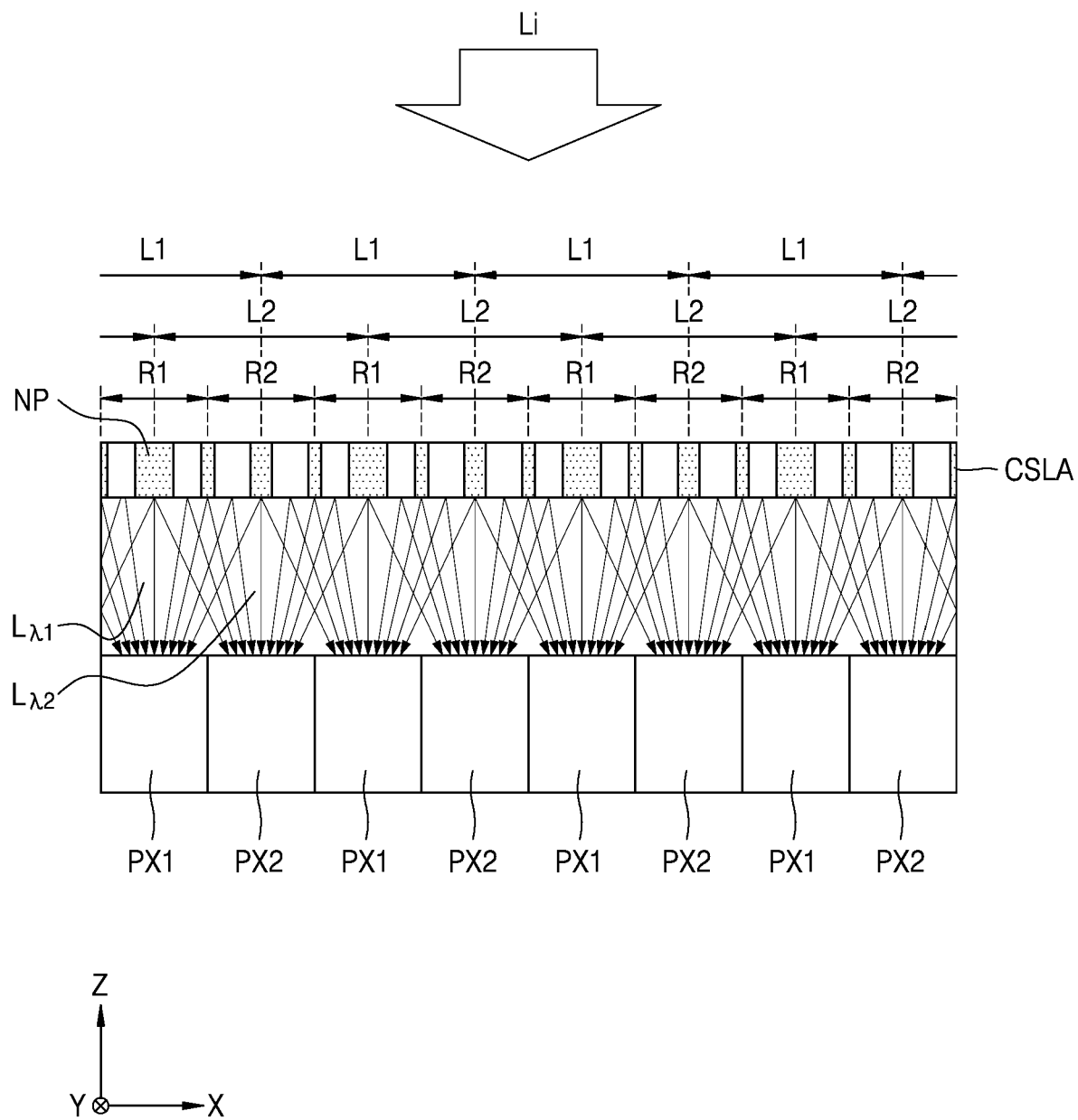
FIGS. 3A and 3B are conceptual diagrams showing a structure and operations of a color separating lens array according to an embodiment.
Figure 3B:
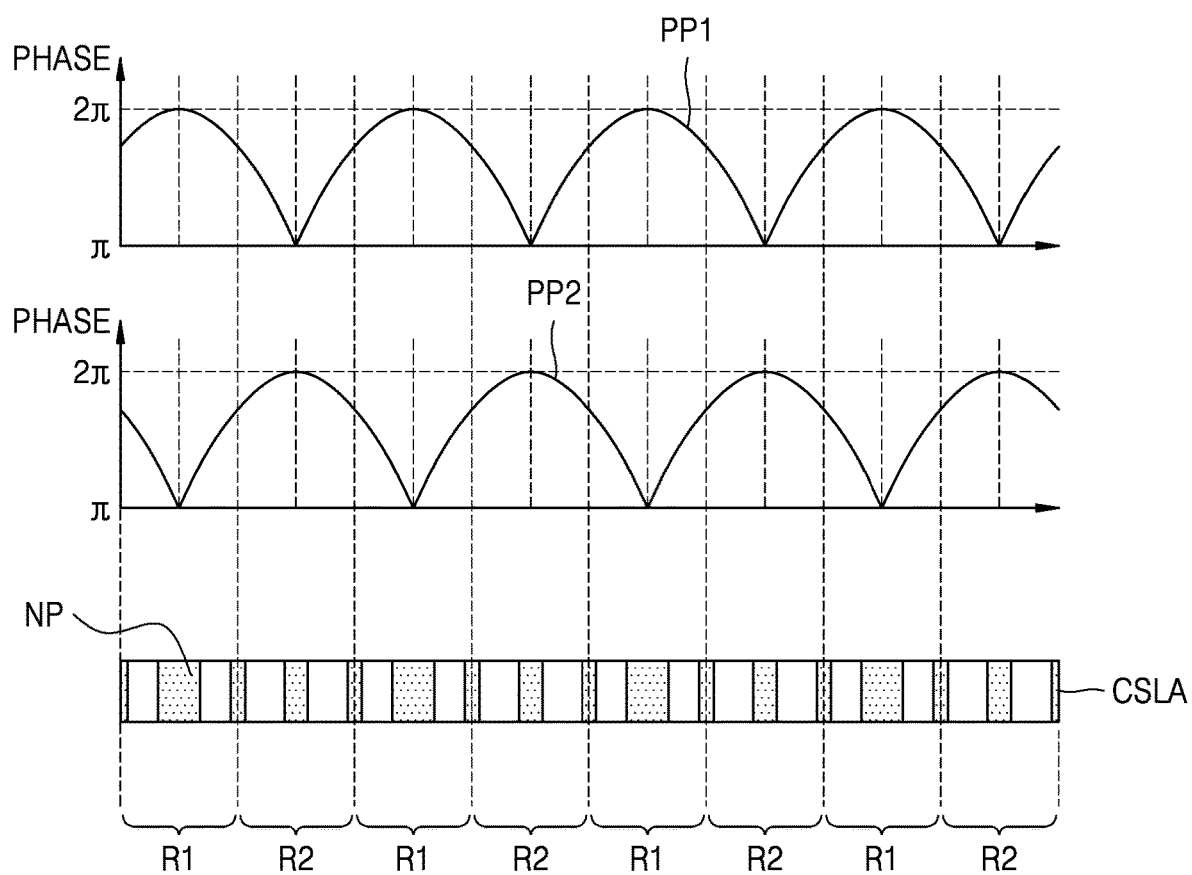

The pixel array 1100 of the image sensor 1000 may include a color separating lens array for condensing light of a color corresponding toward each pixel. FIGS. 3A and 3B are diagrams showing a structure and operations of the color separating lens array.

Referring to FIG. 3A, a color separating lens array CSLA may include a plurality of nanoposts NP that change a phase of incident light Li differently according to incident locations thereof. The color separating lens array CSLA may be partitioned in various ways. For example, the color separating lens array CSLA may be partitioned as a region (hereinafter referred to as a first pixel corresponding region) R1, which corresponds to a first pixel PX1 on which first wavelength light $L_{\lambda 1}$ included in the incident light Li is condensed, and a region (hereinafter referred to as a second pixel corresponding region) R2, which corresponds to a second pixel PX2 on which second wavelength light $L_{\lambda 2}$ included in the incident light Li is condensed. Each of the first and second pixel corresponding regions R1 and R2 may include one or more nanoposts NP, and the first and second pixel corresponding regions R1 and R2 may respectively face the first and second pixels PX1 and PX2. In another example, the color separating lens array CSLA may be partitioned as a first wavelength light condensing region L1 in which the first wavelength light $L_{\lambda 1}$ is condensed onto the first pixel PX1 and a second wavelength light condensing region L2 in which the second wavelength light $L_{\lambda 2}$ is condensed onto the second pixel PX2. The first and second wavelength light condensing regions L1 and L2 may partially overlap each other.

The color separating lens array CSLA may generate different phase profiles of the first wavelength light $L_{\lambda 1}$ and the second wavelength light $L_{\lambda 2}$ included in the incident light Li so that the first wavelength light $L_{\lambda 1}$ may be condensed onto the first pixel PX1 and the second wavelength light $L_{\lambda 2}$ may be condensed onto the second pixel PX2.

For example, referring to FIG. 3B, the color separating lens array CSLA may allow the first wavelength light $L_{\lambda 1}$ to have a first phase profile PP1 and the second wavelength light $L_{\lambda 2}$ to have a second phase profile PP2 at a position immediately after passing through the color separating lens array CSLA, e.g., on a lower surface of the color separating lens array CSLA, such that the first wavelength light $L_{\lambda 1}$ and the second wavelength light $L_{\lambda 2}$ may be respectively condensed on the corresponding first pixel PX1 and the second pixel PX2. In detail, the first wavelength light $L_{\lambda 1}$ that has passed through the color separating lens array CSLA may have the first phase profile PP1 that is largest at the center of the first pixel corresponding region R1 and reduces away from the center of the first pixel corresponding region R1, that is, toward the second pixel corresponding regions R2. Such a phase profile is similar to a phase profile of light converging to one point after passing through a convex lens, e.g., a micro-lens having a convex center in the first wavelength light condensing region L1, and the first wavelength light $L_{\lambda 1}$ may be condensed onto the first pixel PX1. Also, the second wavelength light $L_{\lambda 2}$ that has passed through the color separating lens array CSLA has the second phase profile PP2 that is largest at the center of the second pixel corresponding region R2 and reduces away from the center of the second pixel corresponding region R2, e.g., toward the first pixel corresponding regions R1, and thus, the second wavelength light $L_{\lambda 2}$ may be condensed onto the second pixel PX2.

Because a refractive index of a material varies depending on a wavelength of light, the color separating lens array CSLA may provide different phase profiles with respect to the first and second wavelength light $L_{\lambda 1}$ and $L_{\lambda 2}$, as shown in FIG. 3B. In other words, because the same material has a different refractive index according to the wavelength of light reacting with the material and a phase delay of the light that passes through the material is different according to the wavelength, the phase profile may vary depending on the wavelength. For example, a refractive index of the first pixel corresponding region R1 with respect to the first wavelength light $L_{\lambda 1}$ and a refractive index of the first pixel corresponding region R1 with respect to the second wavelength light $L_{\lambda 2}$ may be different from each other, and the phase delay of the first wavelength light $L_{\lambda 1}$ that passed through the first pixel corresponding region R1 and the phase delay of the second wavelength light $L_{\lambda 2}$ that passed through the first pixel corresponding region R1 may be different from each other. Therefore, when the color separating lens array CSLA is designed based on the characteristics of light, different phase profiles may be provided with respect to the first wavelength light $L_{\lambda 1}$ and the second wavelength light $L_{\lambda 2}$.

The color separating lens array CSLA may include nanoposts NP that are arranged according to a certain rule such that the first and second wavelength light $L_{\lambda 1}$ and $L_{\lambda 2}$ may respectively have the first and second phase profiles PP1 and PP2. Here, the rule may be applied to parameters, such as the shape of the nanoposts NP, sizes (e.g., width and/or height), a distance between the nanoposts NP, and the arrangement form thereof, and these parameters may be determined according to a phase profile to be implemented by the color separating lens array CSLA.

A rule in which the nanoposts NP are arranged in the first pixel corresponding region R1, and a rule in which the nanoposts NP are arranged in the second pixel corresponding region R2 may be different from each other. In other words, sizes, shapes, intervals, and/or arrangement of the nanoposts NP in the first pixel corresponding region R1 may be different from those of the nanoposts NP in the second pixel corresponding region R2.

A cross-sectional diameter of the nanoposts NP may have a dimension of a sub-wavelength. Here, the sub-wavelength refers to a wavelength that is less than a wavelength band of light to be branched by the color separating lens array CSLA. The nanoposts NP may have a dimension that is less than a shorter wavelength of a first wavelength λ1 and a second wavelength λ2. When the incident light Li is a visible ray, the cross-sectional diameter of the nanoposts NP may be less than, for example, 400 nm, 300 nm, or 200 nm. In addition, a height of the nanoposts NP may be about 500 nm to about 1500 nm, which is greater than the cross-sectional diameter of the nanopost. Although not shown in the drawings, the nanoposts NP may be obtained by combining two or more posts stacked in a height direction (e.g., Z direction).

The nanoposts NP may include a material having a higher refractive index than that of a peripheral material. For example, the nanoposts NP may include c-Si, p-Si, a-Si and a Group III-V compound semiconductor (GaP, GaN, GaAs etc.), SiC, $TiO_2$, SiN, and/or a combination thereof. The nanoposts NP having a different refractive index from the refractive index of the peripheral material may change the phase of light that passes through the nanoposts NP. This is caused by a phase delay that occurs due to the shape dimension of the sub-wavelength of the nanoposts NP, and a degree at which the phase is delayed, may be determined by a detailed shape dimension and arrangement shape of the nanoposts NP. A peripheral material of the nanoposts NP may include a dielectric material having a less refractive index than that of the nanoposts NP. For example, the peripheral material may include $SiO_2$ or air.

The first wavelength λ1 and the second wavelength λ2 may be in a wavelength band of infrared rays and visible rays. However, one or more embodiments are not limited thereto, and a variety of wavelength bands may be implemented according to the rule of arrays of the plurality of nanoposts NP. Also, it is described that two wavelengths are branched from the incident light and condensed as an example. However, embodiments are not limited thereto. The incident light may be branched into three directions or more according to wavelengths and condensed.

Also, the color separating lens array CSLA may include one single layer, or the color separating lens array CSLA may have a structure in which a plurality of layers are stacked. For example, a first layer may condense the visible ray toward a certain pixel and a second layer may condense the infrared ray toward another pixel.

Hereinafter, an example in which the color separating lens array CSLA described above is applied to the pixel array 1100 of the image sensor 1000 will be described below in detail.

Figure 4A:
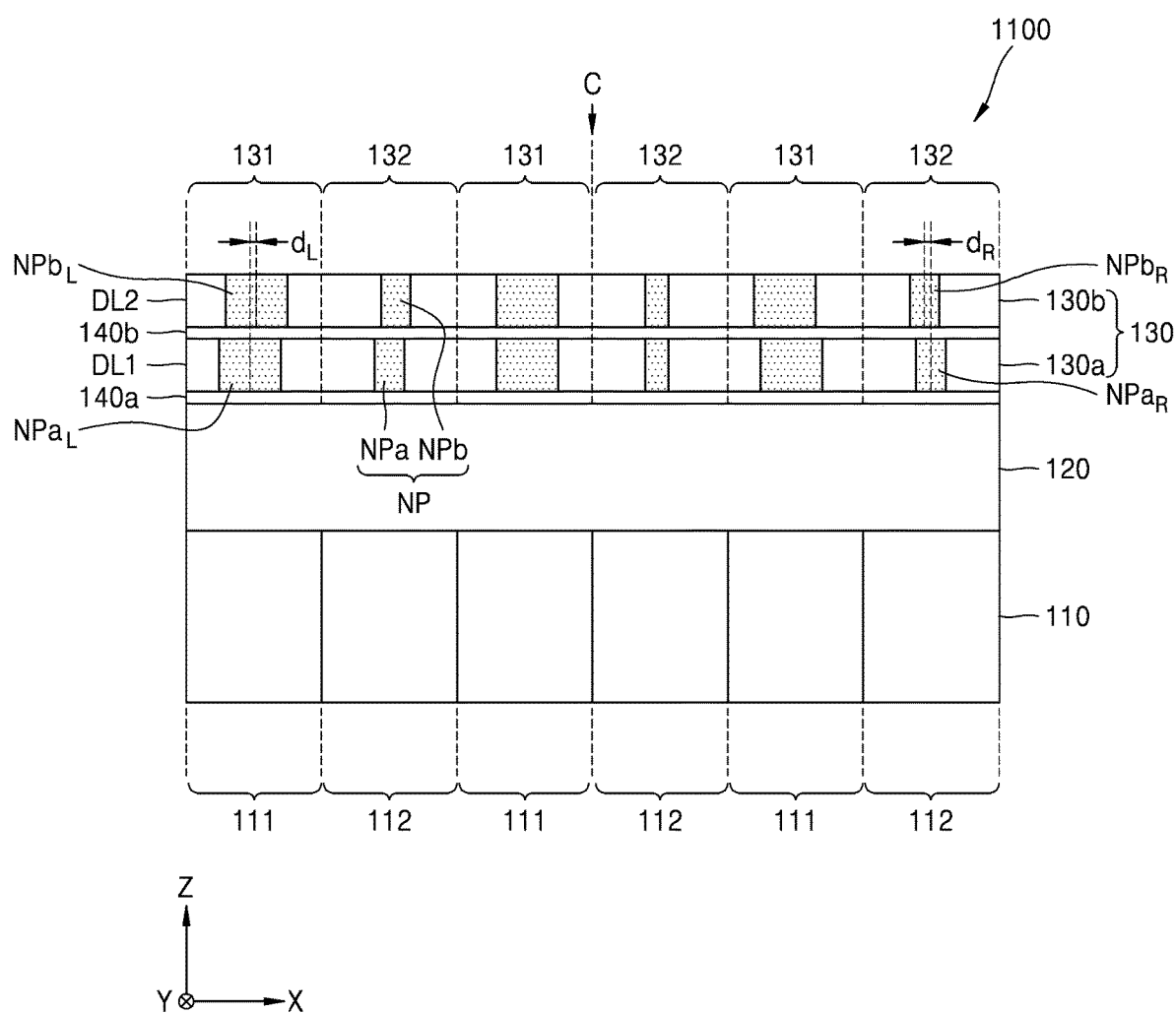
FIGS. 4A and 4B are cross-sectional views of a pixel array in an image sensor according to an embodiment, viewed from different directions.
Figure 4B:
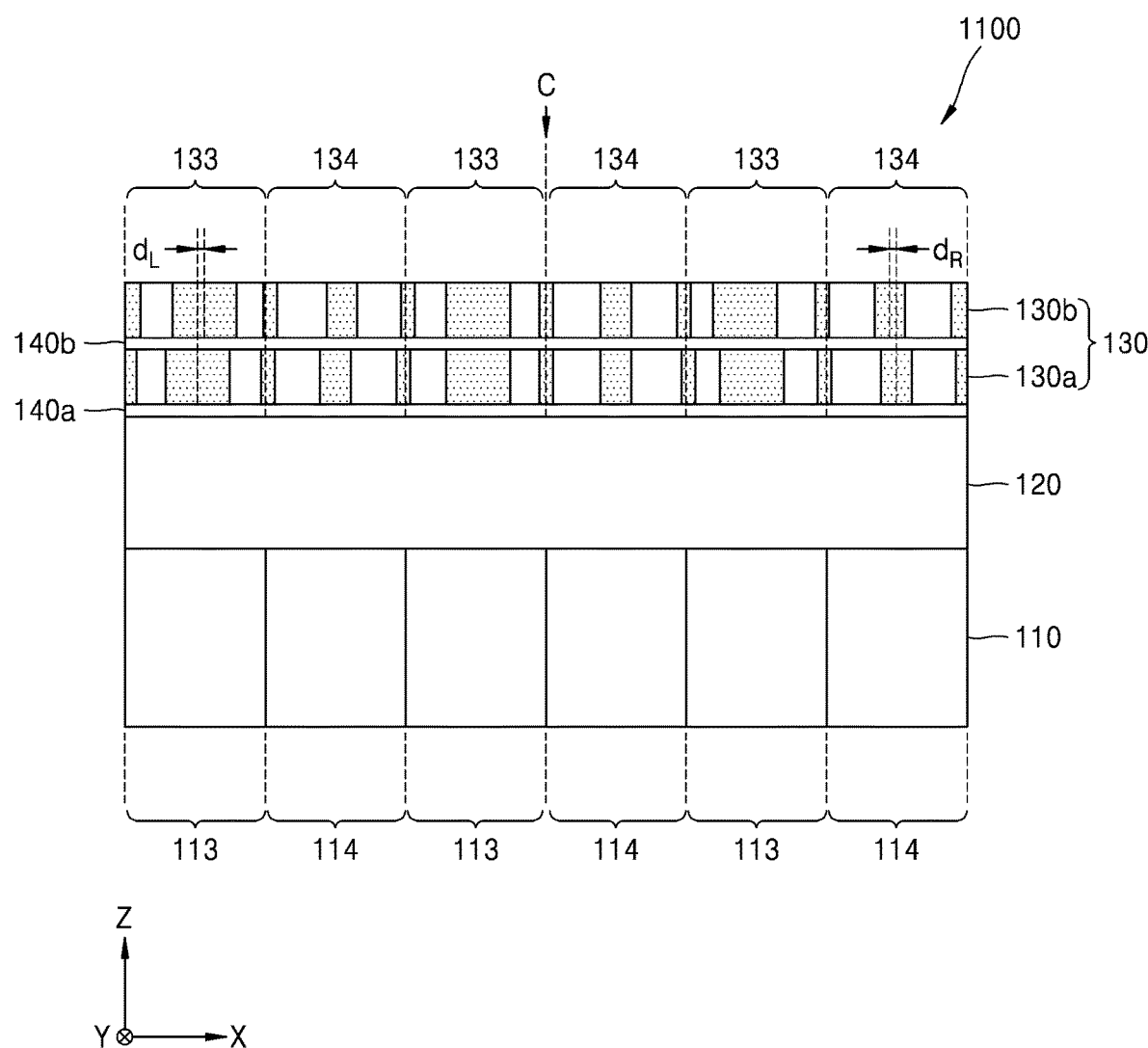
Figure 5A:
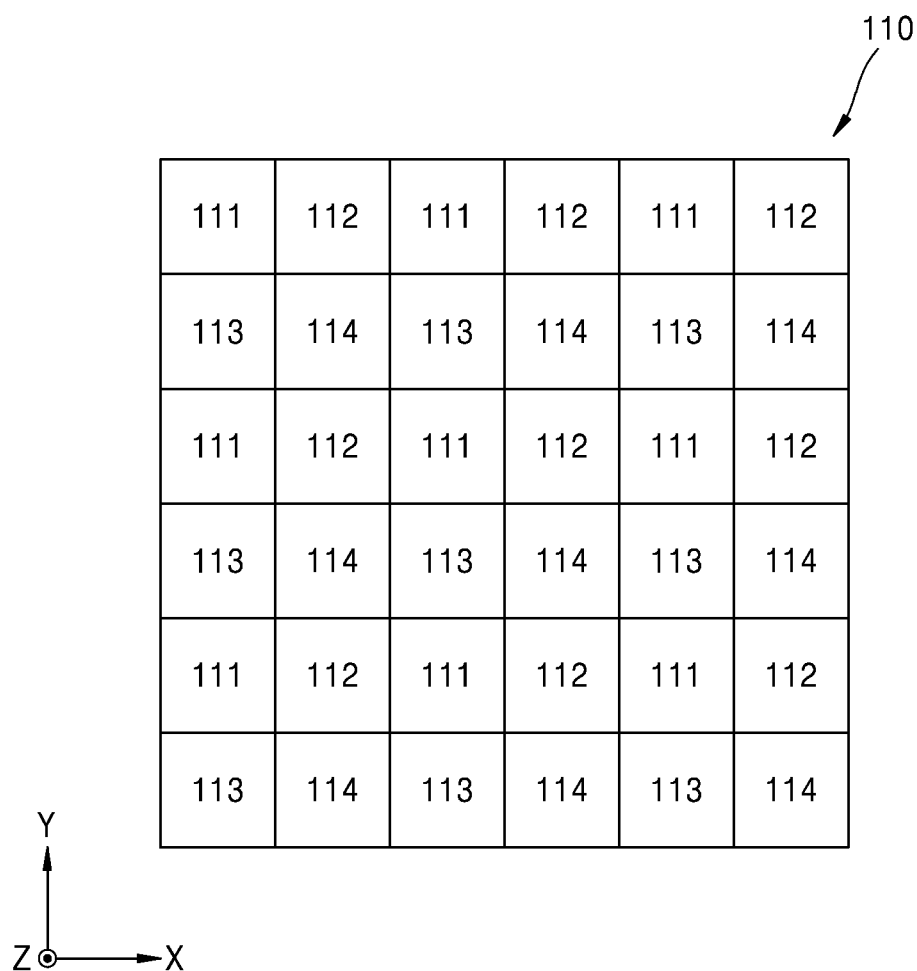
FIG. 5A is a plan view showing a pixel arrangement in a pixel array according to an embodiment.
Figure 5B:
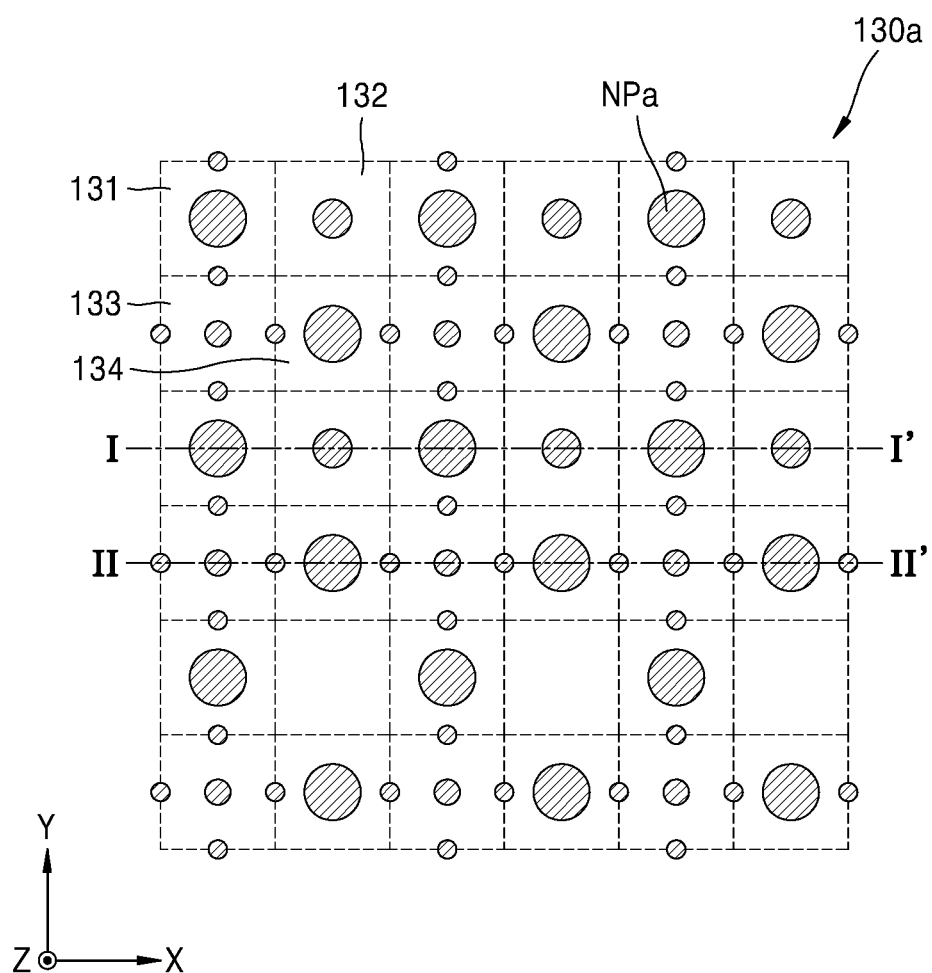
FIG. 5B is a plan view showing an example of arranging a plurality of nanoposts in a plurality of regions of a color separating lens array according to an embodiment.
Figure 5C:
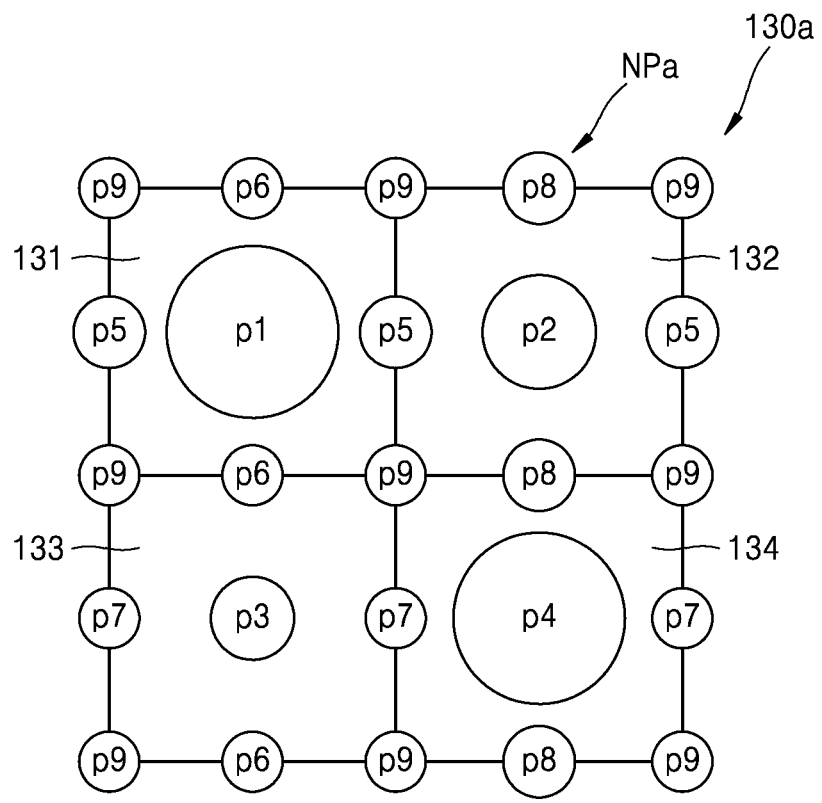
FIG. 5C is a plan view showing an enlarged view of a part in FIG. 5B.
Figure 5D:
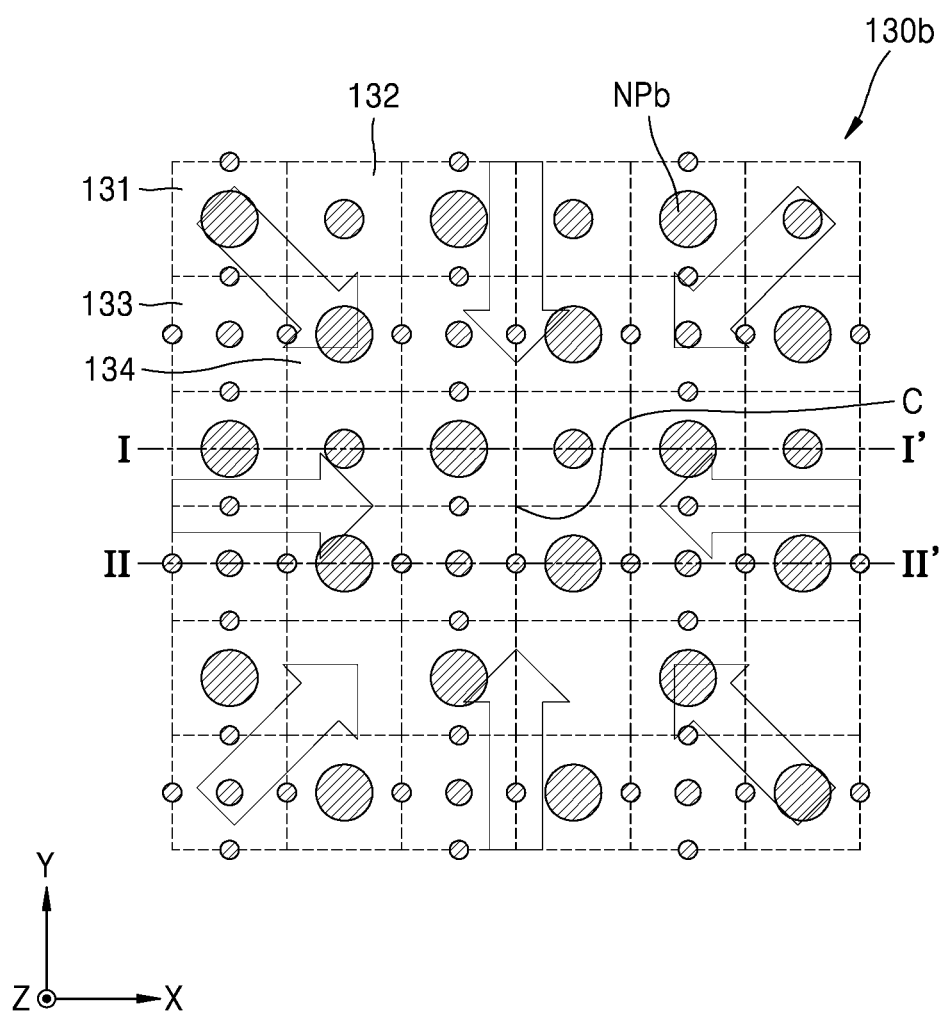
FIG. 5D is a plan view showing an example of arranging nanoposts in a second lens layer according to an embodiment.

FIGS. 4A and 4B are diagrams showing a pixel array according to an embodiment viewed from different cross-sections, FIG. 5A is a plan view showing arrangement of photosensitive cells in the pixel array, FIG. 5B is a plan view showing an example of arranging nanoposts in a first lens layer 130a, FIG. 5C is a plan view showing an enlarged view of a part of FIG. 5B, and FIG. 5D is a plan view showing an example of arranging nanoposts in a second lens layer 130b.

Referring to FIGS. 4A and 4B, the pixel array 1100 of the image sensor 1000 includes a sensor substrate 110 including a plurality of pixels 111, 112, 113, and 114 for sensing light, a spacer layer 120 that is transparent and disposed on the sensor substrate 110, and a color separating lens array 130 on the spacer layer 120.

The sensor substrate 110 may include a first green pixel 111, a blue pixel 112, a red pixel 113, and a second green pixel 114 that convert light into electrical signals. In addition, the first green pixel 111 and the blue pixel 112 are alternately arranged in a first direction (e.g., X direction) as shown in FIG. 4A, and in a different cross-section as shown in FIG. 4B, the red pixel 113 and the second green pixel 114 may be alternately arranged. FIG. 5A shows the arrangement of photosensitive cells when the pixel array 1100 of the image sensor 1000 has the Bayer pattern arrangement as shown in FIG. 2A. The arrangement above is provided for separately sensing the incident light with unit patterns such as the Bayer pattern, for example, the first and second green pixels 111 and 114 may sense green light, the blue pixel 112 may sense blue light, and the red pixel 113 may sense red light. Although not shown in the drawings, a separator for separating cells may be further formed on a boundary between cells.

The spacer layer 120 is arranged between the sensor substrate 110 and the color separating lens array 130 in order to maintain a constant distance between the sensor substrate 110 and the color separating lens array 130. The spacer layer 120 may include a material transparent with respect to the visible ray, for example, a dielectric material having a lower refractive index than that of the nanoposts NP and low absorption coefficient in the visible ray band, e.g., $SiO_2$, siloxane-based spin on glass (SOG), etc. A thickness h of the spacer layer 120 may be selected within a range of $h_t-p \le h \le h_t+p$. Here, a theoretical thickness $h_t$ of the spacer layer 120 may be expressed as Equation 1 below, when a refractive index of the spacer layer 120 with respect to a wavelength $\lambda_0$ is n, and a pixel pitch is p.

$$h_t = \frac{np^2}{\lambda_0} - \frac{\lambda_0}{4n} \quad \text{[Equation 1]}$$

The theoretical thickness $h_t$ of the spacer layer 120 may refer to a focal length at which light having a wavelength of $\lambda_0$ is focused onto a top surface of the pixels 111, 112, 113, and 114 by the color separating lens array 130. $\lambda_0$ may denote a wavelength that is a reference for determining the thickness h of the spacer layer 120, and the thickness of the spacer layer 120 may be designed based on a central wavelength of the green light, that is, 540 nm.

The color separating lens array 130 may be supported by the spacer layer, and may include a plurality of lens layers 130a and 130b in which nanoposts NP are formed. A dielectric material having a lower refractive index than that of the material included in the nanoposts NP, e.g., air or $SiO_2$, may be included in the color separating lens array 130. The first lens layer 130a of the color separating lens array 130 may include nanoposts NPa including a high-refractive index material and a first dielectric material layer DL1 that includes a low-refractive index material filled in spaces among the nanoposts NPa. Also, the second lens layer 130b of the color separating lens array 130 may include nanoposts NPb including a high-refractive index material and a second dielectric material layer DL2 that includes a low-refractive index material filled in spaces among the nanoposts NPb.

Referring to FIG. 5B and FIG. 5D, the color separating lens array 130 may be partitioned into four pixel corresponding regions (e.g., a first green pixel corresponding region, a blue pixel corresponding region, a red pixel corresponding region, and a second green pixel corresponding region) 131, 132, 133, and 134 respectively corresponding to the pixels 111, 112, 113, and 114 of FIG. 5A. The first green pixel corresponding region 131 corresponds to the first green pixel 111 and may be on the first green pixel 111, the blue pixel corresponding region 132 corresponds to the blue pixel 112 and may be on the blue pixel 112, the red pixel corresponding region 133 corresponds to the red pixel 113 and may be on the red pixel 113, and the second green pixel corresponding region 134 corresponds to the second green pixel 114 and may be on the second green pixel 114. That is, the pixel corresponding regions 131, 132, 133, and 134 of the color separating lens array 130 may be arranged respectively facing the pixels 111, 112, 113, and 114 of the sensor substrate 110. The pixel corresponding regions 131, 132, 133, and 134 may be two-dimensionally arranged in the first direction (e.g., X direction) and the second direction (e.g., Y direction) such that a first row in which the first green pixel corresponding region 131 and the blue pixel corresponding region 132 are alternately arranged and a second row in which the red pixel corresponding region 133 and the second green pixel corresponding region 134 are alternately arranged are alternately repeated. The color separating lens array 130 includes a plurality of unit patterns that are two-dimensionally arranged like the pixel array of the sensor substrate 110, and each of the unit patterns includes the pixel corresponding regions 131, 132, 133, and 134 arranged in a 2×2 array.

The color separating lens array 130 may include the nanoposts NP, of which sizes, shapes, intervals, and/or arrangements are defined in a manner such that the green light is separated and condensed toward the first and second green pixels 111 and 114, the blue light is separated and condensed toward the blue pixel 112, and the red light is separated and condensed toward the red pixel 113. In addition, a thickness of the color separating lens array 130 in a third direction (e.g., Z direction) may be similar to heights of the nanoposts NP, and may be about 500 nm to about 1500 nm.

Referring to FIG. 5B, the first lens layer 130a may include the nanoposts NPa having cylindrical shapes each having a circular cross-section in the pixel corresponding regions 131, 132, 133, and 134. In center portions of respective regions, the nanoposts NPa having different cross-sectional areas are arranged, and the nanoposts NPa may be also arranged at the center on a boundary between pixels and a crossing point between the pixel boundaries.

FIG. 5C shows the arrangement of the nanoposts NPa included in partial regions of FIG. 5B, that is, the pixel corresponding regions 131, 132, 133, and 134 in the unit pattern. In FIG. 5C, the nanoposts NPa are indicated as p1 to p9 according to locations thereof. Referring to FIG. 5C, from among the nanoposts NPa, a nanopost p1 at the center of the first green pixel corresponding region 131 and a nanopost p4 at the center of the second green pixel corresponding region 134 have cross-sectional areas that are greater than those of a nanopost p2 at the center of the blue pixel corresponding region 132 and a nanopost p3 at the center of the red pixel corresponding region 133, and the cross-sectional area of the nanopost p2 at the center of the blue pixel corresponding region 132 is greater than that of the nanopost p3 at the center of the red pixel corresponding region 133. However, one or more embodiments are not limited to the above example, and depending on an embodiment, the nanoposts NPa having various shapes, sizes, and arrangements may be applied.

The nanoposts NPa included in the first and second green pixel corresponding regions 131 and 134 may have different distribution rules in the first direction (X direction) and the second direction (Y direction). For example, the nanoposts NPa arranged in the first and second green pixel corresponding regions 131 and 134 may have different size arrangements in the first direction (X direction) and the second direction (Y direction). As shown in FIG. 5C, from among the nanoposts NPa, a cross-sectional area of a nanopost p5 at a boundary between the first green pixel corresponding region 131 and the blue pixel corresponding region 132 that is adjacent to the first green pixel corresponding region 131 in the first direction (X direction) is different from that of the nanoposts p6 at a boundary between the first green pixel corresponding region 131 and the red pixel corresponding region 133 that is adjacent to the first green pixel corresponding region 131 in the second direction (Y direction). Likewise, a cross-sectional area of the nanopost p7 at a boundary between the second green pixel corresponding region 134 and the red pixel corresponding region 133 that is adjacent to the second green pixel corresponding region 134 in the first direction (X direction) is different from that of the nanopost p8 at a boundary between the second green pixel corresponding region 134 and the blue pixel corresponding region 132 that is adjacent to the second green pixel corresponding region 134 in the second direction (Y direction).

On the other hand, the nanoposts NPa arranged in the blue pixel corresponding region 132 and the red pixel corresponding region 133 may have symmetrical arrangement rules in the first direction (X direction) and the second direction (Y direction). As shown in FIG. 5C, from among the nanoposts NPa, the cross-sectional area of the nanoposts p5 at a boundary between the blue pixel corresponding region 132 and adjacent pixel corresponding regions in the first direction (X direction) and the cross-sectional areas of the nanoposts p8 at a boundary between the blue pixel corresponding region 132 and the adjacent pixel corresponding regions in the second direction (Y direction) are the same as each other, and in the red pixel corresponding region 133, the cross-sectional areas of the nanoposts p7 at a boundary between adjacent pixel corresponding regions in the first direction (X direction) and the cross-sectional areas of the nanoposts p6 at a boundary between adjacent pixel corresponding regions in the second direction (Y direction) are the same as each other.

In addition, the nanoposts p9 at four corners in each of the pixel corresponding regions 131, 132, 133, and 134, that is, points where the four regions cross one another, have the same cross-sectional areas as one another.

The above distribution is based on the pixel arrangement in the Bayer pattern. Adjacent pixels to the blue pixel 112 and the red pixel 113 in the first direction (X direction) and the second direction (Y direction) are the green pixels G, whereas the adjacent pixel to the first green pixel 111 in the first direction (X direction) is the blue pixel 112 and the adjacent pixel to the first green pixel 111 in the second direction (Y direction) is the red pixel R. In addition, the adjacent pixel to the second green pixel 114 in the first direction (X direction) is the red pixel 113 and the adjacent pixel to the second green pixel 114 in the second direction (Y direction) is the blue pixel 112. In addition, adjacent pixels to the first and second green pixels 111 and 114 in four diagonal directions are other green pixels, adjacent pixels to the blue pixel 112 in the four diagonal directions are the red pixels 113, and adjacent pixels to the red pixel 113 in the four diagonal directions are the blue pixels 112. Therefore, in the blue and red pixel corresponding regions 132 and 133 respectively corresponding to the blue pixel 112 and the red pixel 113, the nanoposts NPa may be arranged in the form of 4-fold symmetry, and in the first and second green pixel corresponding regions 131 and 134, the nanoposts NPa may be arranged in the form of 2-fold symmetry. In particular, the first and second green pixel corresponding regions 131 and 134 are rotated by 90° angle with respect to each other.

The plurality of nanoposts NPa have symmetrical circular cross-sectional shapes in FIGS. 5B and 5C. However, some nanoposts having asymmetrical cross-sectional shapes may be included. For example, the first and second green pixel corresponding regions 131 and 134 may adopt the nanoposts having asymmetrical cross-sections, each of which has different widths in the first direction (X direction) and the second direction (Y direction), and the blue and red pixel corresponding regions 132 and 133 may adopt the nanoposts having symmetrical cross-sections, each of which has the same widths in the first direction (X direction) and the second direction (Y direction).

FIG. 5D illustrates an example of a plan view of the second lens layer 130b. Shapes and arrangements of the nanoposts NPb in the second lens layer 130b are similar to those of the first lens layer 130a, except that the second lens layer 130b may include the nanoposts NPb that are shifted in a direction toward a center C of the color separating lens array 130 as compared with the nanoposts NPa of the first lens layer 130a. For example, referring to FIG. 4A, a nanopost $NPb_R$ at a right side of the second lens layer 130b may be shifted as much as $d_R$ in the direction toward the center C of the color separating lens array 130 as compared with a corresponding nanopost $NPa_R$ of the first lens layer 130a, and a nanopost $NPb_L$ at a left side of the second lens layer 130b may be shifted as much as & in the direction toward the center C of the color separating lens array 130 as compared with a corresponding nanopost $NPa_L$ of the first lens layer 130a. The second lens layer 130b includes the shifted nanoposts $NPb_R$ and $NPb_L$ because an angle of a chief ray incident on the color separating lens array 130 varies depending on a position in the color separating lens array, and the shifted amount may be proportional to a distance to the center C of the color separating lens array 130. In other words, as the distance from the center C of the color separating lens array 130 increases, the shifted amount of the nanoposts NPb may increase.

The second lens layer 130b of FIG. 5D includes the nanoposts NPb, the number of which may be the same as that of the nanoposts NPa formed in the first lens layer 130a. Alternatively, the second lens layer 130b may include more or less nanoposts NPb than the nanoposts NPa of the first lens layer 130a. For example, the nanopost NPa is formed at a boundary between the first green pixel corresponding region 131 and the red pixel corresponding region 133 of the first lens layer 130a, but the nanopost NPb may not be formed at a corresponding position in the second lens layer 130b.

In addition, referring back to FIGS. 4A and 4B, first and second etch prevention layers 140a and 140b may be respectively formed under the first and second lens layers 130a and 130b. The first etch prevention layer 140a may be arranged between the spacer layer 120 and the first lens layer 130a such that the spacer layer 120 may not be damaged due to the process of forming the first lens layer 130a, and the second etch prevention layer 140b may be arranged between the first lens layer 130a and the second lens layer 130b such that the first lens layer 130a may not be damaged due to the process of forming the second lens layer 130b. The first and second etch prevention layers 140a and 140b may each include an $HfO_2$ layer, and may be formed throughout the entire surface of the color separating lens array 130. The first and second etch prevention layers 140a and 140b may have a thickness that is sufficient enough to perform a protective function of the lower layer without degrading the optical characteristics of the color separating lens array 130, and the thickness of the first and second etch prevention layers 140a and 140b may be, for example, about 3 nm to about 30 nm or about 5 nm to about 15 nm.

Figure 6A:
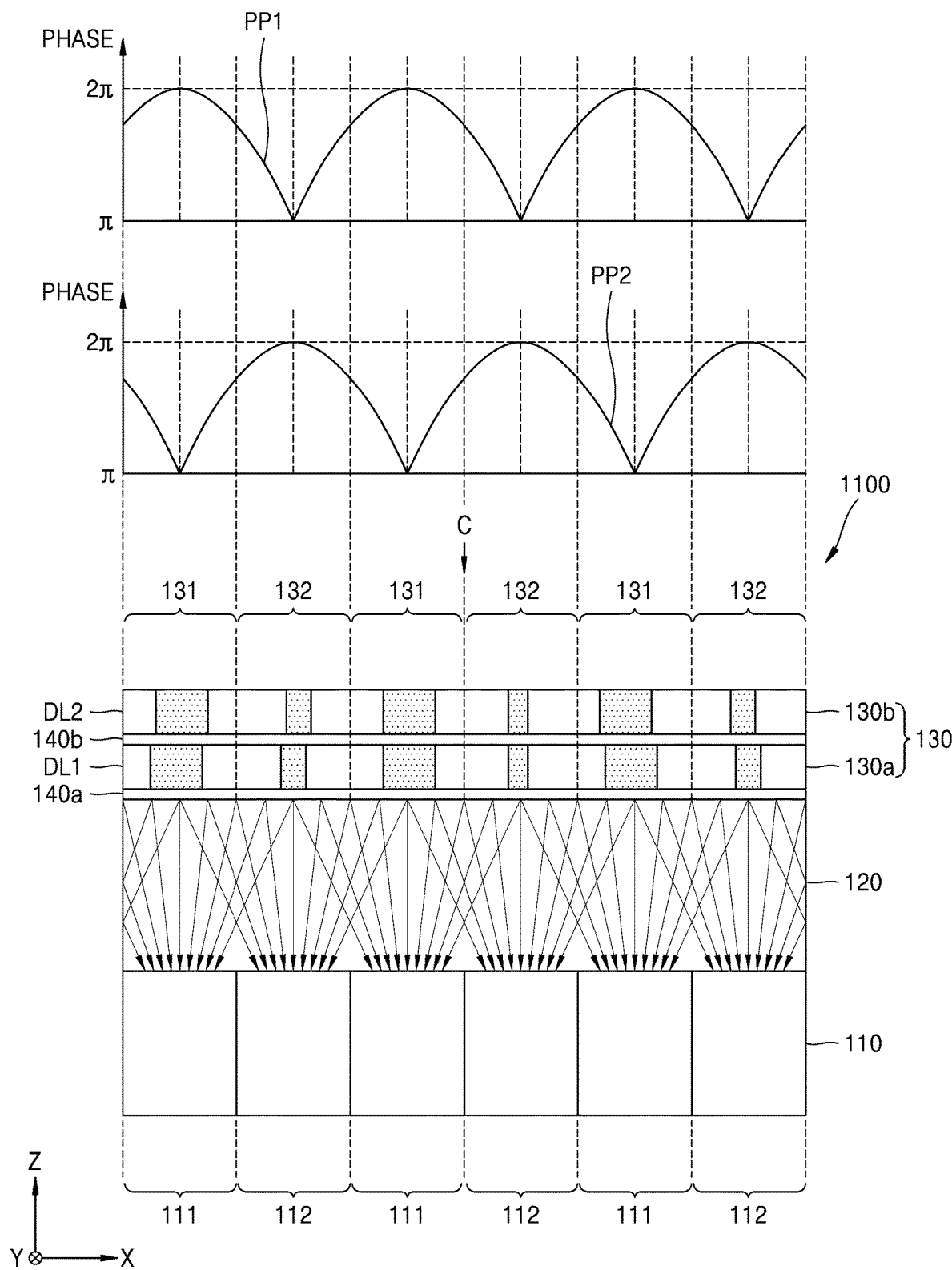
FIG. 6A is a diagram showing phase profiles of green light and blue light that have passed through a color separating lens array along line I-I' of FIG. 5B.
Figure 6B:
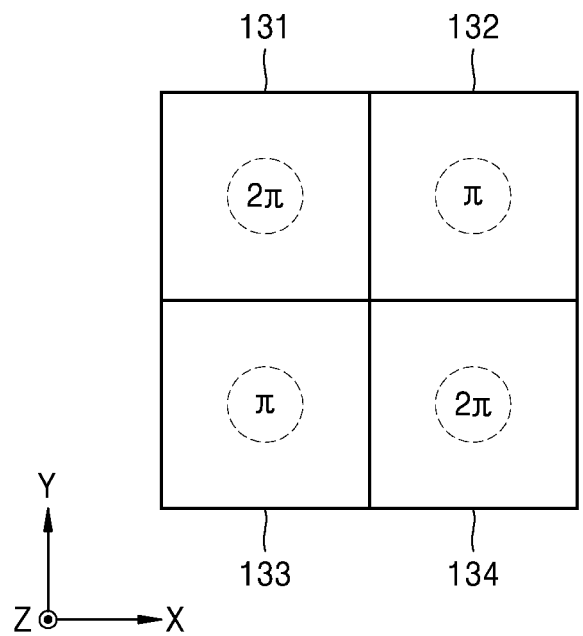
FIG. 6B is a diagram showing a phase of the green light that has passed through the color separating lens array of FIG. 5B at a center of pixel corresponding regions.
Figure 6C:
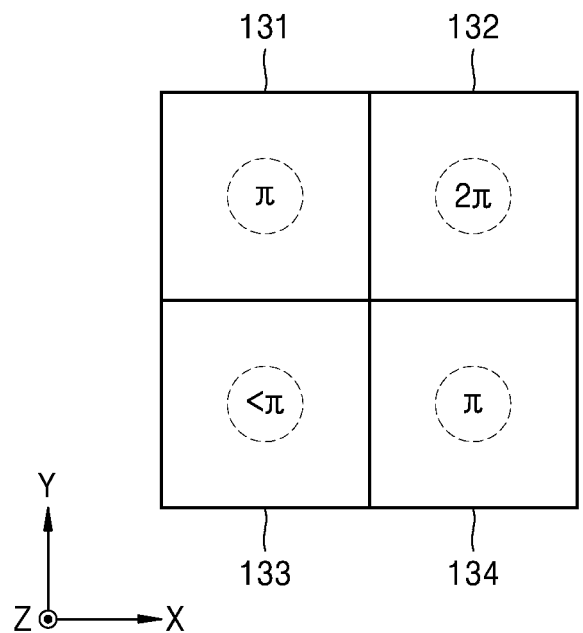
FIG. 6C is a diagram showing a phase of blue light that has passed through the color separating lens array of FIG. 5B at the center of pixel corresponding regions.

FIG. 6A shows phase profiles of the green light and the blue light that have passed through the color separating lens array 130 in line I-I' of FIG. 5B, FIG. 6B shows the phase of the green light that has passed through the color separating lens array 130 at centers of the pixel corresponding regions 131, 132, 133, and 134, and FIG. 6C shows the phase of the blue light that has passed through the color separating lens array 130 at the centers of the pixel corresponding regions 131, 132, 133, and 134. The phase profiles of the green light and the blue light shown in FIG. 6A are similar to those of the first and second wavelength light exemplarily shown in FIG. 3B.

Referring to FIGS. 6A and 6B, the green light that has passed through the color separating lens array 130 may have a first phase profile PP1 that is the largest at the center of the first green pixel corresponding region 131 and is reduced away from the center of the first green pixel corresponding region 131. In detail, immediately after passing through the color separating lens array 130, that is, at a lower surface of the color separating lens array 130 or an upper surface of the spacer layer 120, the phase of the green light is the largest at the center of the first green pixel corresponding region 131 and reduces at a position of a larger concentric circle away from the center of the first green pixel corresponding region 131. Thus, the phase is the smallest at the centers of the blue and red pixel corresponding regions 132 and 133 in the X and Y directions, and at contact points between the first green pixel corresponding region 131 and the second green pixel corresponding region 134 in the diagonal direction. When a phase of the green light is set as a based on the phase of light emitted from the center of the first green pixel corresponding region 131, the light having a phase of about $0.9\pi$ to about $1.1\pi$ may be emitted from the centers of the blue and red pixel corresponding regions 132 and 133, and the light having a phase of about $1.1\pi$ to about $1.5\pi$ may be emitted from a contact point between the first green pixel corresponding region 131 and the second green pixel corresponding region 134. In addition, the first phase profile PP1 does not denote that the phase delay amount of the light that has passed through the center of the first green pixel corresponding region 131 is the largest, but when the phase of light that has passed through the first green pixel corresponding region 131 is $2\pi$ and a phase delay amount of the light that has passed through another point is greater and has a phase value of a or greater, the first phase profile PP1 of the green light may denote a value remaining after subtracting $2n\pi$, that is, the wrapped phase profile. For example, when the phase of light that has passed through the first green pixel corresponding region 131 is $2\pi$ and the phase of light that has passed through the center of the blue pixel corresponding region 132 is $3\pi$, the phase in the blue pixel corresponding region 132 may be remaining $\pi$ after subtracting 2 $n\pi$ (n=1) from $3\pi$.

Referring to FIGS. 6A and 6C, the blue light that has passed through the color separating lens array 130 may have a second phase profile PP2 that is the largest at the center of the blue pixel corresponding region 132 and reduced away from the center of the blue pixel corresponding region 132. In detail, immediately after passing through the color separating lens array 130, the phase of the blue light is the largest at the center of the blue pixel corresponding region 132 and reduces at a position of a larger concentric circle away from the center of the blue pixel corresponding region 132, the phase is the smallest at the centers of the first and second green pixel corresponding regions 131 and 134 in the X direction and the Y direction and the smallest at the center of the red pixel corresponding region 133 in the diagonal direction. When the phase of the blue light at the center of the blue pixel corresponding region 132 is $2\pi$, the phase at the centers of the first and second green pixel corresponding regions 131 and 134 may be about, for example, about $0.9\pi$ to about $1.1\pi$, and the phase at the center of the red pixel corresponding region 133 may be less than that at the centers of the first and second green pixel corresponding regions 131 and 134, for example, about $0.5\pi$ to about $0.9\pi$.

Figure 6D:
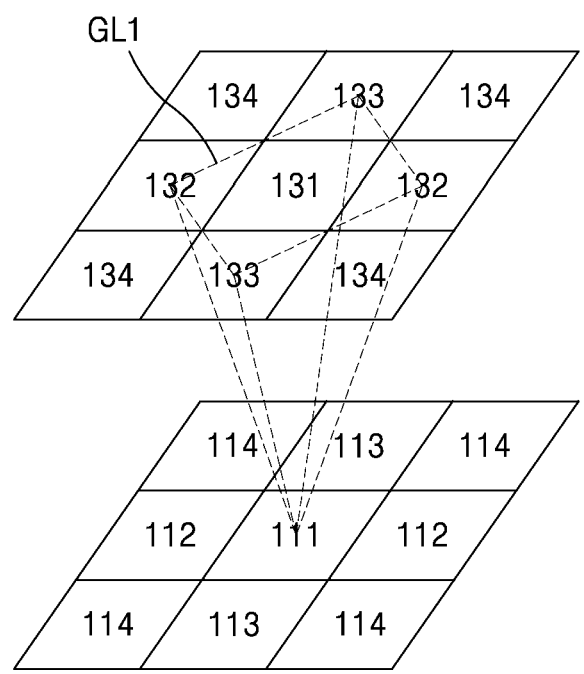
FIG. 6D is a diagram showing an example of a traveling direction of green light incident on a first green light condensing region according to an embodiment.
Figure 6E:
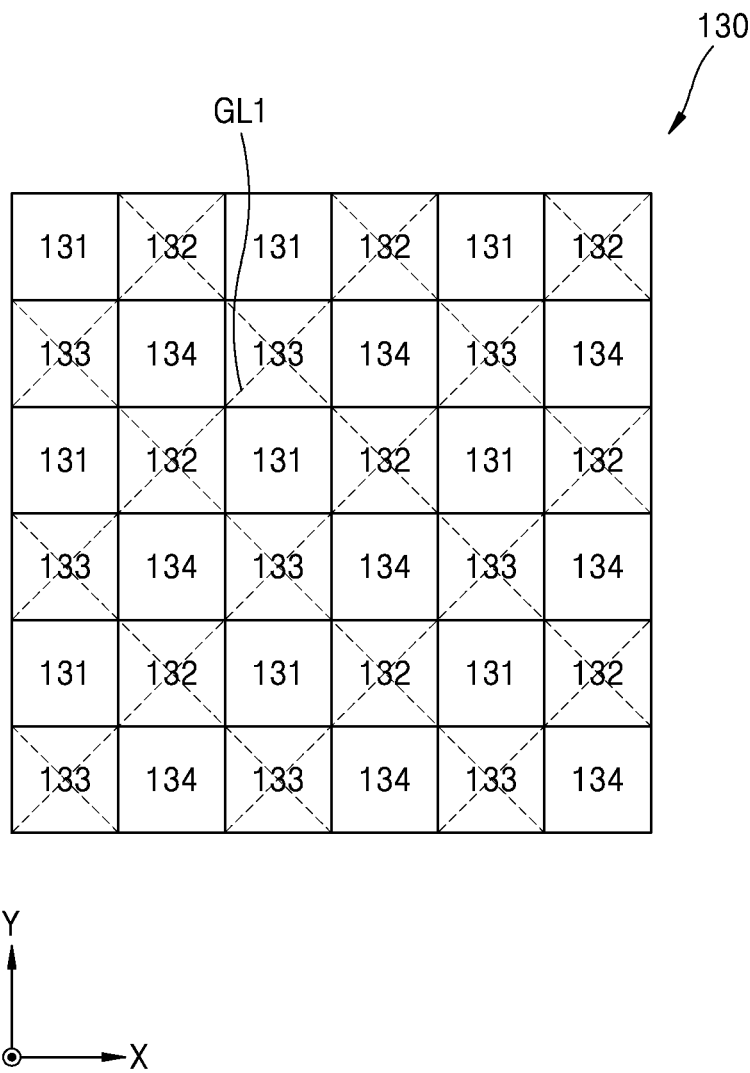
FIG. 6E is a diagram showing an example of an array of the first green light condensing region according to an embodiment.

FIG. 6D shows an example of a traveling direction of green light incident on a first green light condensing region, and FIG. 6E shows an example of an array of the first green light condensing region.

As shown in FIG. 6D, the green light incident on the vicinity of the first green pixel corresponding region 131 is condensed to the first green pixel 111 by the color separating lens array 130, and the green light from the blue and red pixel corresponding regions 132 and 133, in addition to the first green pixel corresponding region 131, is also incident on the first green pixel 111. That is, according to the phase profile of the green light described above with reference to FIGS. 6A and 6B, the green light that has passed through a first green light condensing region GL1 that is obtained by connecting centers of two blue pixel corresponding regions 132 and two red pixel corresponding regions 133 that are adjacent to the first green pixel corresponding region 131 is condensed onto the first green pixel 111. Therefore, as shown in FIG. 6E, the color separating lens array 130 may operate as a first green light condensing region array for condensing the green light onto the first green pixel 111. The first green light condensing region GL1 may have a greater area than that of the corresponding first green pixel 111, e.g., may be 1.2 times to two times greater than that of the first green pixel 111.

Figure 6F:
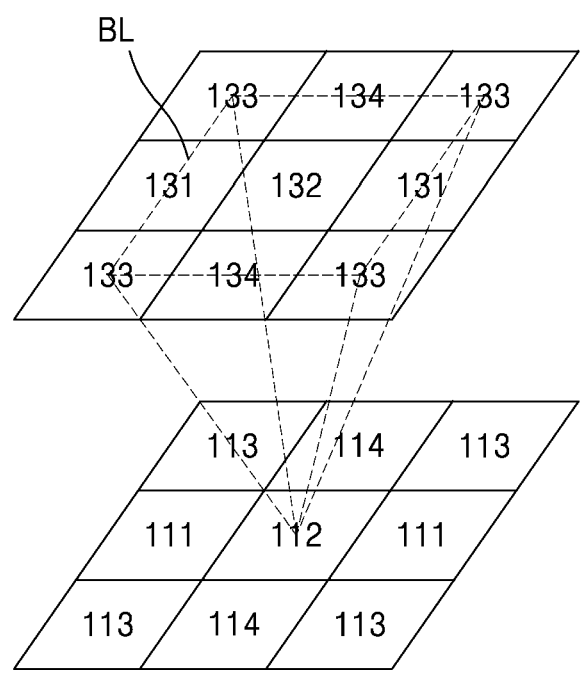
FIG. 6F is a diagram showing an example of a traveling direction of blue light incident on a blue light condensing region.

FIG. 6F shows an example of a traveling direction of blue light incident on a first blue light condensing region, and FIG. 6E shows an example of an array of the blue light condensing region.

Figure 6G:
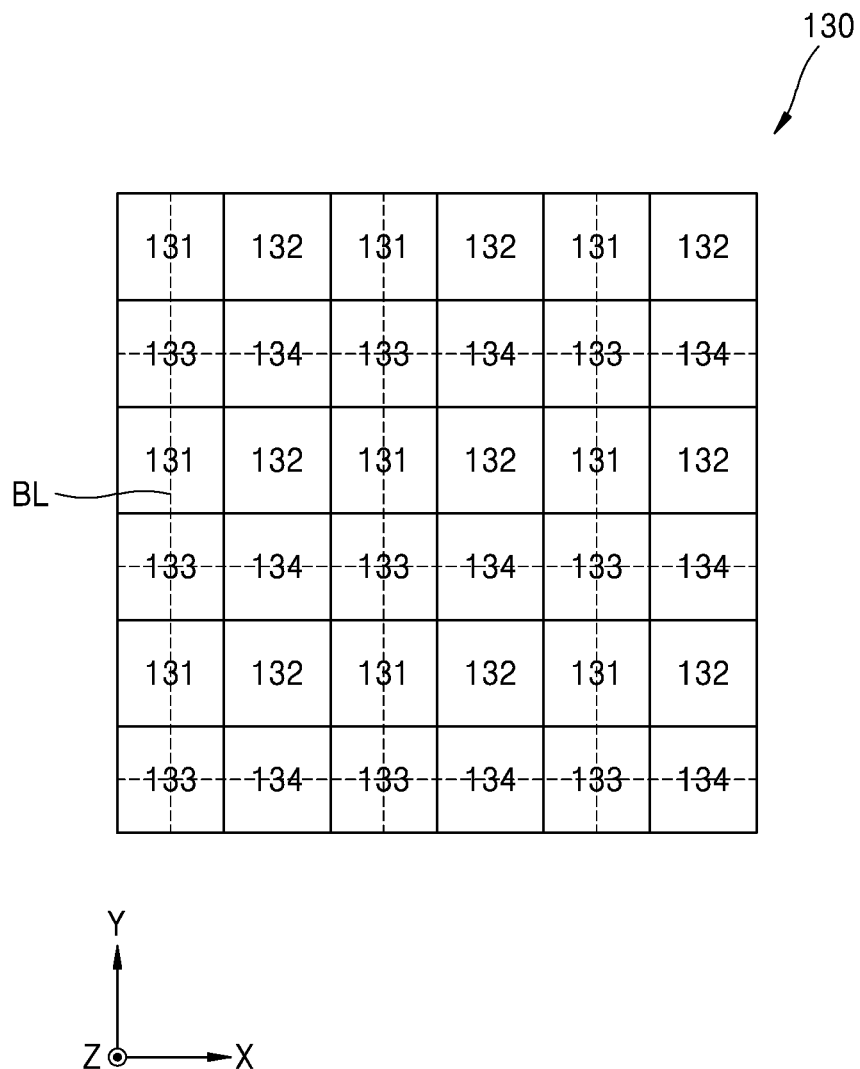
FIG. 6G is a diagram showing an example of an array of the blue light condensing region.

The blue light is condensed onto the blue pixel 112 by the color separating lens array 130 as shown in FIG. 6F, and the blue light from the pixel corresponding regions 131, 132, 133, and 134 is incident on the blue pixel 112. In the phase profile of the blue light described above with reference to FIGS. 6A and 6C, the blue light that has passed through a blue light condensing region BL that is obtained by connecting centers of four red pixel corresponding regions 133 adjacent to the blue pixel corresponding region 132 at vertices is condensed onto the blue pixel 112. Therefore, as shown in FIG. 6G, the color separating lens array 130 may operate as a blue light condensing region array for condensing the blue light to the blue pixel. The blue light condensing region BL has an area greater than that of the blue pixel 112, e.g., may be 1.5 to 4 times greater. The blue light condensing region BL may partially overlap the first green light condensing region GL1, a red light condensing region RL (see FIG. 7D), and a second green light condensing region GL2 (see FIG. 7F) that will be described later.

Figure 7A:
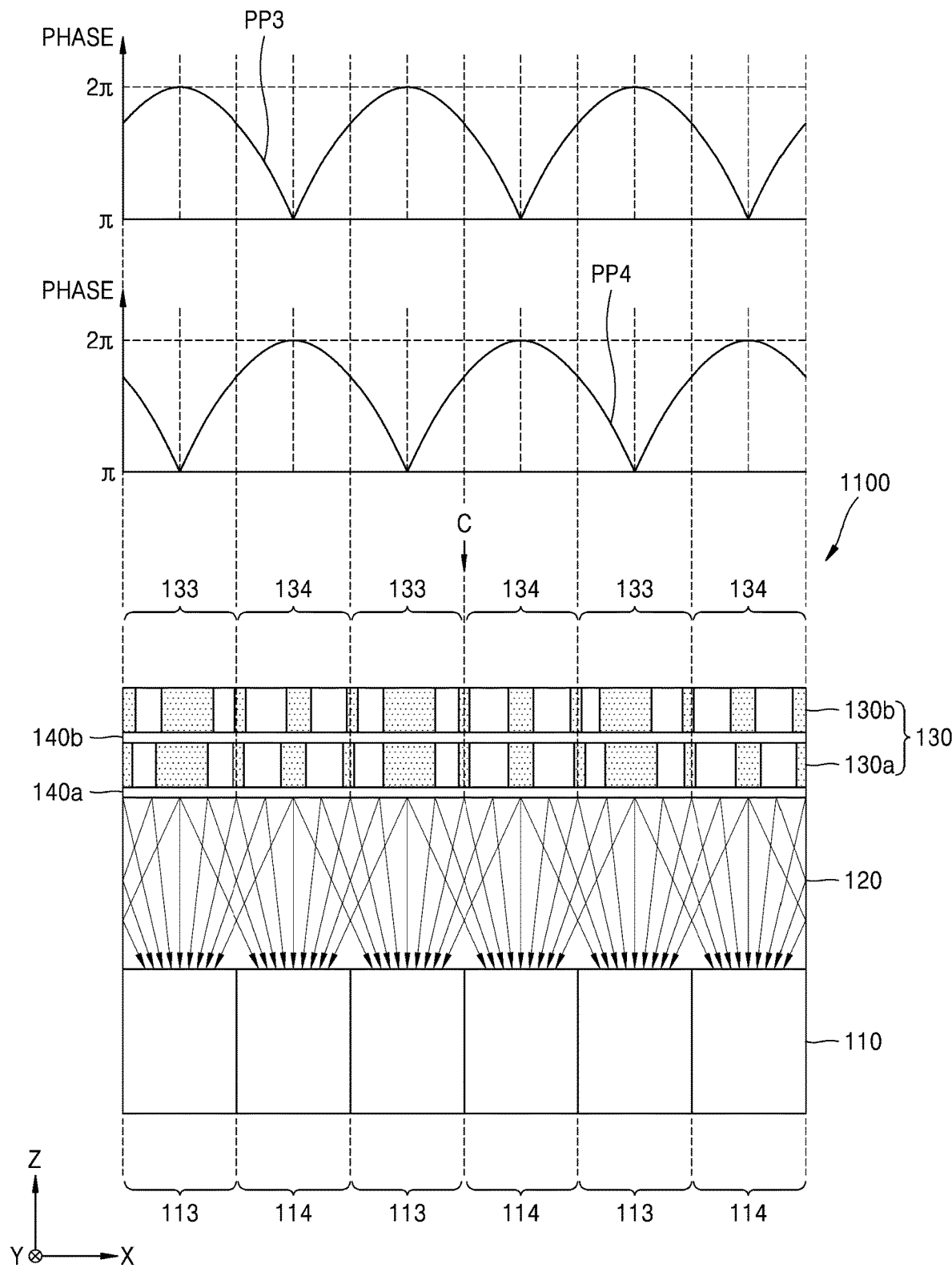
FIG. 7A is a diagram showing phase profiles of red light and green light that have passed through a color separating lens array along line II-II' of FIG. 5B.
Figure 7B:
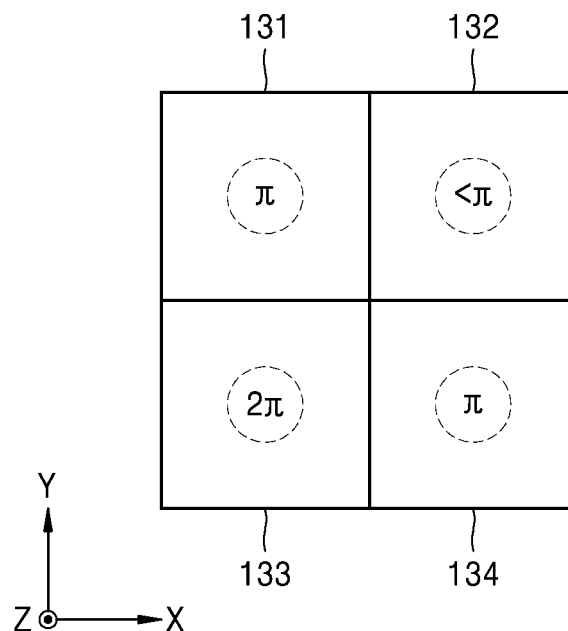
FIG. 7B is a diagram showing a phase of the red light that has passed through the color separating lens array of FIG. 5B at a center of pixel corresponding regions.
Figure 7C:
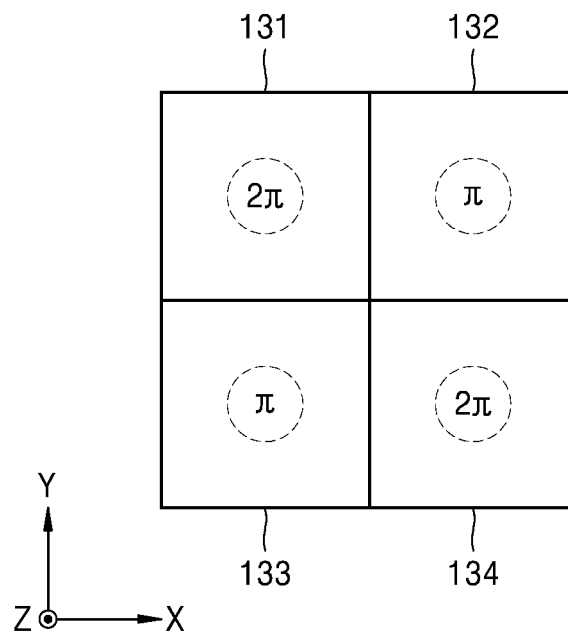
FIG. 7C is a diagram showing a phase of green light that has passed through the color separating lens array of FIG. 5B at the center of pixel corresponding regions.

FIG. 7A shows phase profiles of the green light and the red light that have passed through the color separating lens array 130 in line II-II' of FIG. 5B, FIG. 7B shows the phase of the red light that has passed through the color separating lens array 130 at centers of the pixel corresponding regions 131, 132, 133, and 134, and FIG. 7C shows the phase of the green light that has passed through the color separating lens array 130 at the centers of the pixel corresponding regions 131, 132, 133, and 134.

Referring to FIGS. 7A and 7B, the red light that has passed through the color separating lens array 130 may have a third phase profile PP3 that is the largest at the center of the red pixel corresponding region 133 and reduced away from the center of the red pixel corresponding region 133. In detail, immediately after passing through the color separating lens array 130, the phase of the red light is the largest at the center of the red pixel corresponding region 133 and reduces at a position of a larger concentric circle away from the center of the red pixel corresponding region 133, and the phase is the smallest at the centers of the first and second green pixel corresponding regions 131 and 134 in the X direction and the Y direction and the smallest at the center of the blue pixel corresponding region 132 in the diagonal direction. When the phase of the red light at the center of the red pixel corresponding region 133 is $2\pi$, the phase at the centers of the first and second green pixel corresponding regions 131 and 134 may be about, for example, about $0.9\pi$ to about $1.1\pi$, and the phase at the center of the blue pixel corresponding region 132 may be less than that at the centers of the first and second green pixel corresponding regions 131 and 134, for example, about $0.6\pi$ to about $0.9\pi$.

Referring to FIGS. 7A and 7C, the green light that has passed through the color separating lens array 130 may have a fourth phase profile PP4 that is the largest at the center of the second green pixel corresponding region 134 and reduced away from the center of the second green pixel corresponding region 134. When the first phase profile PP1 of the green light shown in FIG. 6A is compared with the fourth phase profile PP4 of the green light shown in FIG. 7A, the fourth phase profile PP4 may be obtained by moving the first phase profile PP1 in parallel in X and Y directions as much as a first pixel pitch. That is, the first phase profile PP1 has the largest phase at the center of the first green pixel corresponding region 131, but the fourth phase profile PP4 has the largest phase at the center of the second green pixel corresponding region 134 that is apart by one-pixel pitch from the center of the first green pixel corresponding region 131 in the X direction and the Y direction. The phase profiles in FIGS. 6B and 7C showing the phases at the centers of the pixel corresponding regions 131, 132, 133, and 134 may be the same as each other. Regarding the phase profile of the green light based on the second green pixel corresponding region 134, when the phase of the green light emitted from the center of the second green pixel corresponding region 134 is set as $2n$, the light having the phase of about $0.9\pi$ to about $1.1\pi$ may be emitted from the centers of the blue and red pixel corresponding regions 132 and 133 and the light having the phase of about $1.1\pi$ to about $1.5\pi$ may be emitted from the contact point between the first green pixel corresponding region 131 and the second green pixel corresponding region 134.

Figure 7D:
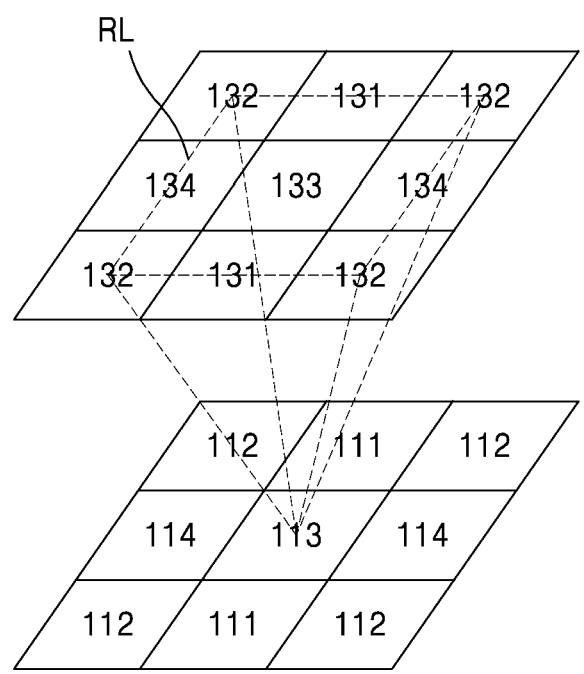
FIG. 7D is a diagram showing an example of a proceeding direction of red light incident on a red light condensing region according to an embodiment.
Figure 7E:
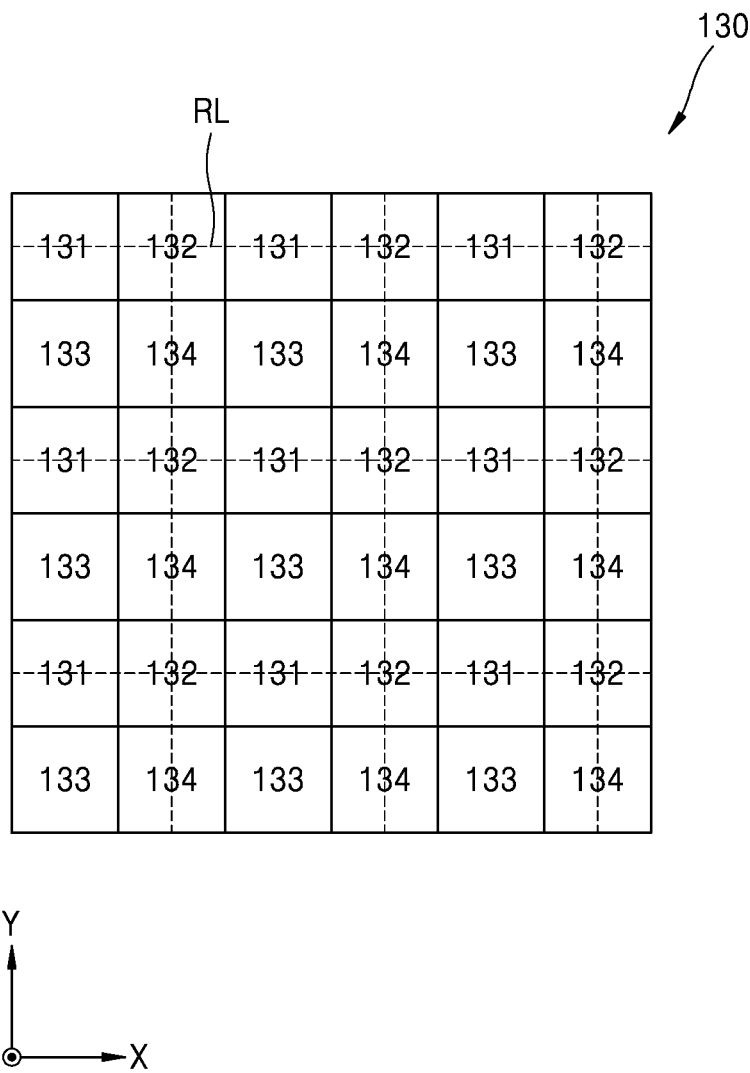
FIG. 7E is a diagram showing an example of an array of the red light condensing region according to an embodiment.

FIG. 7D shows an example of a proceeding direction of red light incident on a red light condensing region, and FIG. 7E shows an example of an array of the red light condensing region.

The red light is condensed onto the red pixel 113 by the color separating lens array 130 as shown in FIG. 7D, and the red light from the pixel corresponding regions 131, 132, 133, and 134 is incident on the red pixel 113. In the phase profile of the red light described above with reference to FIGS. 7A and 7B, the red light that has passed through a red light condensing region RL that is obtained by connecting centers of four blue pixel corresponding regions 132 adjacent to the red pixel corresponding region 133 at vertices is condensed onto the red pixel 113. Therefore, as shown in FIG. 7E, the color separating lens array 130 may operate as a red light condensing region array for condensing the red light to the red pixel. The red light condensing region RL has an area greater than that of the red pixel 113, e.g., may be 1.5 to 4 times greater. The red light condensing region RL may partially overlap the first green light condensing region GL1, the blue light condensing region BL, and the second green light condensing region GL2 (see FIG. 7F) that will be described later.

Figure 7F:
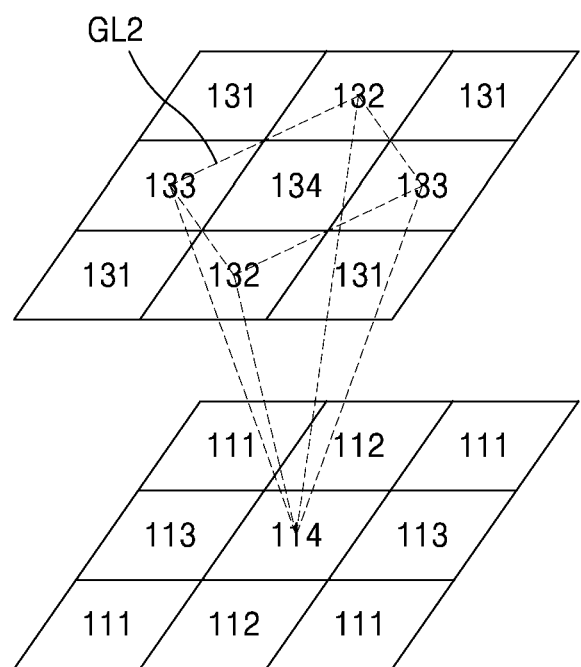
FIG. 7F is a diagram showing an example of a proceeding direction of green light incident on a second green light condensing region according to an embodiment.
Figure 7G:
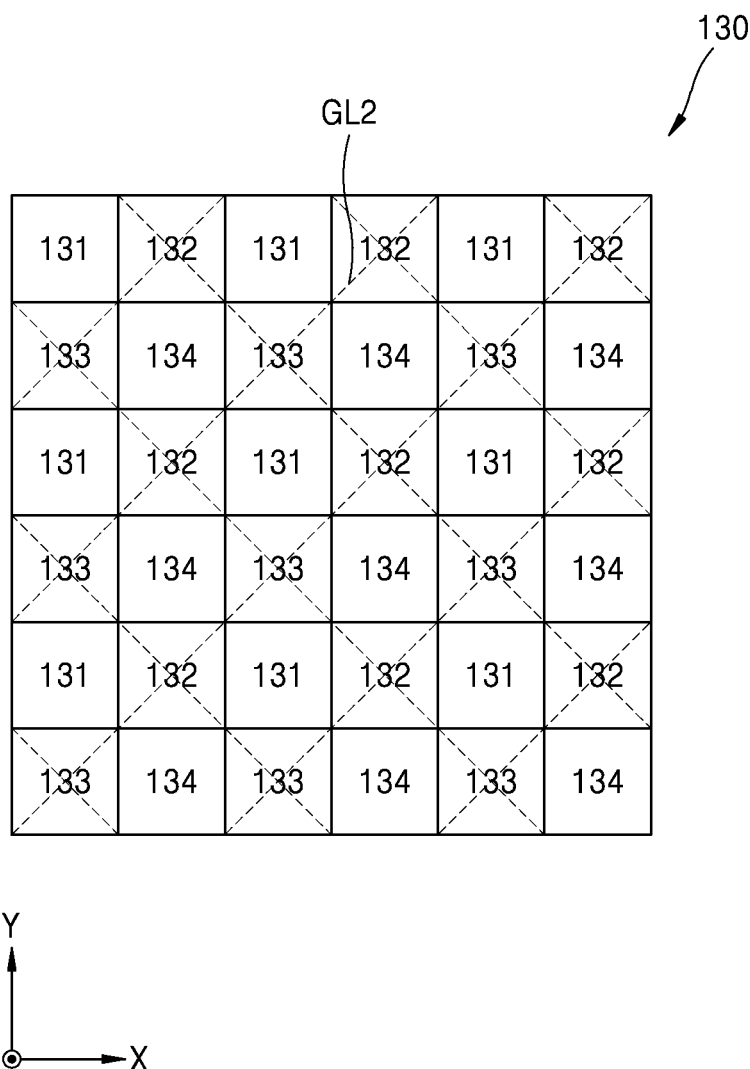
FIG. 7G is a diagram showing an example of an array of the second green light condensing region according to an embodiment.

Referring to FIGS. 7F and 7G, the green light incident on the vicinity of the second green pixel corresponding region 134 proceeds similarly to the green light incident on the vicinity of the first green pixel corresponding region 131, and as shown in FIG. 7F, the green light is condensed onto the second green pixel 114. The green light from the blue and red pixel corresponding regions 132 and 133, in addition to the second green pixel corresponding region 134, is incident on the second green pixel 114. That is, according to the phase profile of the green light described above with reference to FIGS. 7A and 7B, the green light that has passed through the second green light condensing region GL2 that is obtained by connecting centers of two blue pixel corresponding regions 132 and two red pixel corresponding regions 133 that are adjacent to the first green pixel corresponding region 131 is condensed onto the second green pixel 114. Therefore, as shown in FIG. 7G, the color separating lens array 130 may operate as a second green light condensing region array for condensing the green light onto the second green pixel 114. The second green light condensing region GL2 may have a greater area than that of the corresponding second green pixel 114, e.g., may be 1.2 times to twice greater.

FIGS. 8A to 8H are diagrams for illustrating a method of manufacturing a pixel array 1100 of FIG. 4A.

Figure 8A:
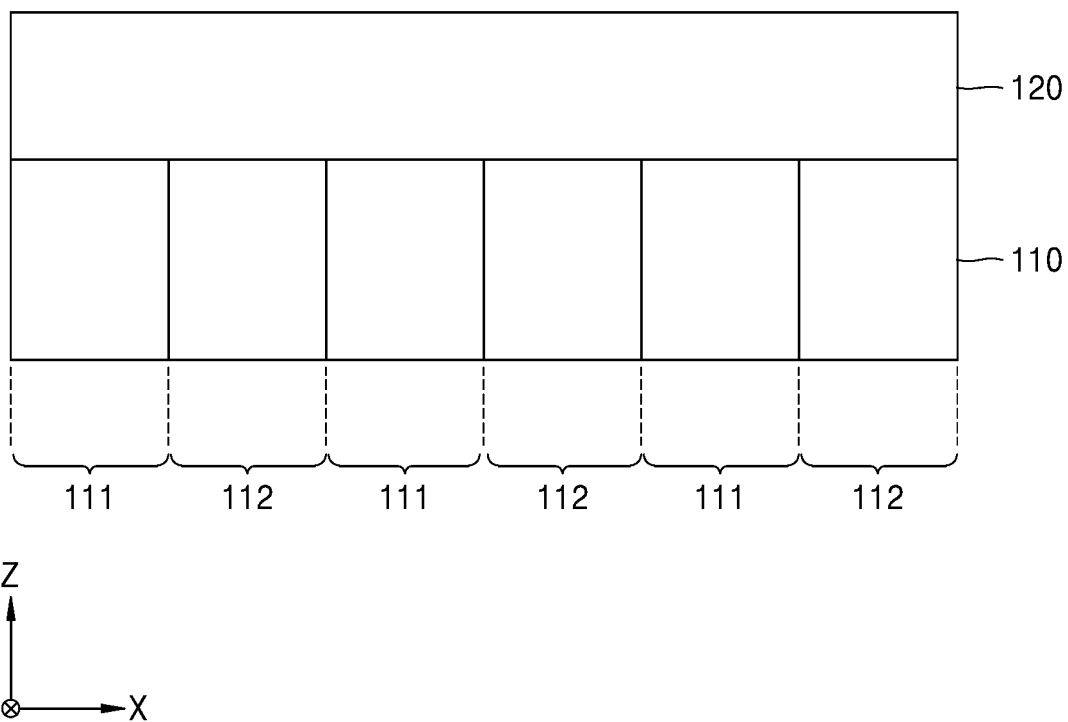
FIGS. 8A to 8H are diagrams for illustrating a method of manufacturing a pixel array of FIG. 4A.

As shown in FIG. 8A, the spacer layer 120 is formed on the sensor substrate 110. The spacer layer 120 may include, for example, an SiO$_2$ layer, and may be formed by various physical or chemical methods, e.g., a thermal oxidation method.

Figure 8B:
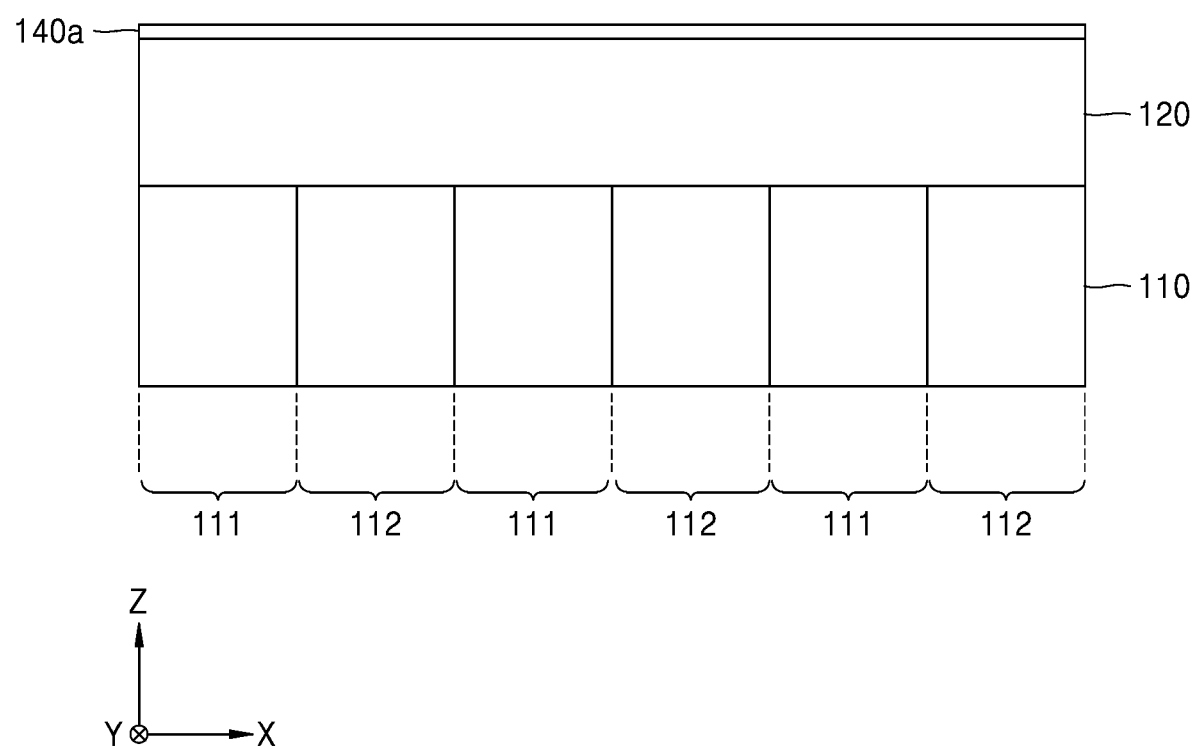

Next, as shown in FIG. 8B, the first etch prevention layer 140a is formed on the spacer layer 120. The first etch prevention layer 140a may include a material that may selectively etch the first dielectric material layer DL1, that is, a material that is not etched by a material used to etch the first dielectric material layer DL1. For example, the first etch prevention layer 140a may include HfO$_2$. A HfO$_2$ layer may be formed by a physical or chemical method, e.g., a physical vapor deposition (PVD), chemical vapor deposition (CVD), a Plasma-Enhanced Chemical Vapor Deposition (PE-CVD), and atomic layer deposition (ALD), etc.

Figure 8C:
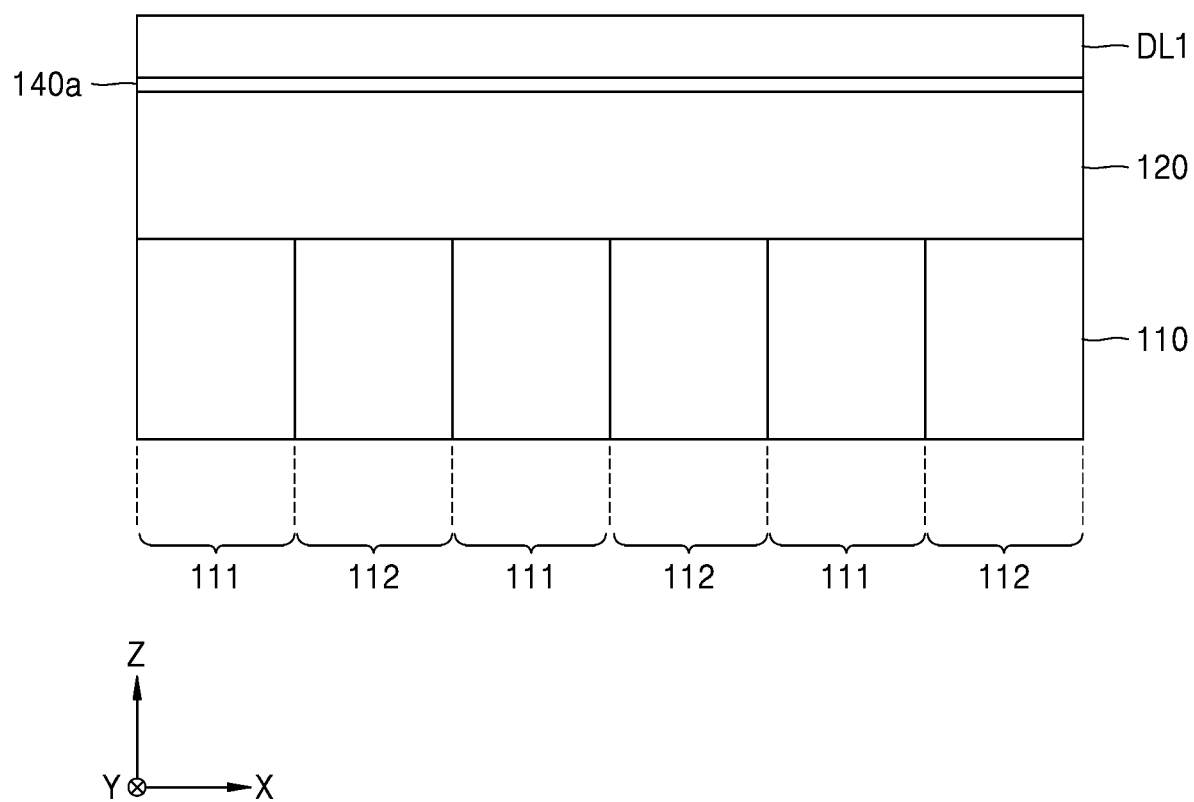

Next, as shown in FIG. 8C, the first dielectric material layer DL1 is formed on the first etch prevention layer 140a. The first dielectric material layer DL1 may include a SiO$_2$ layer.

Figure 8D:
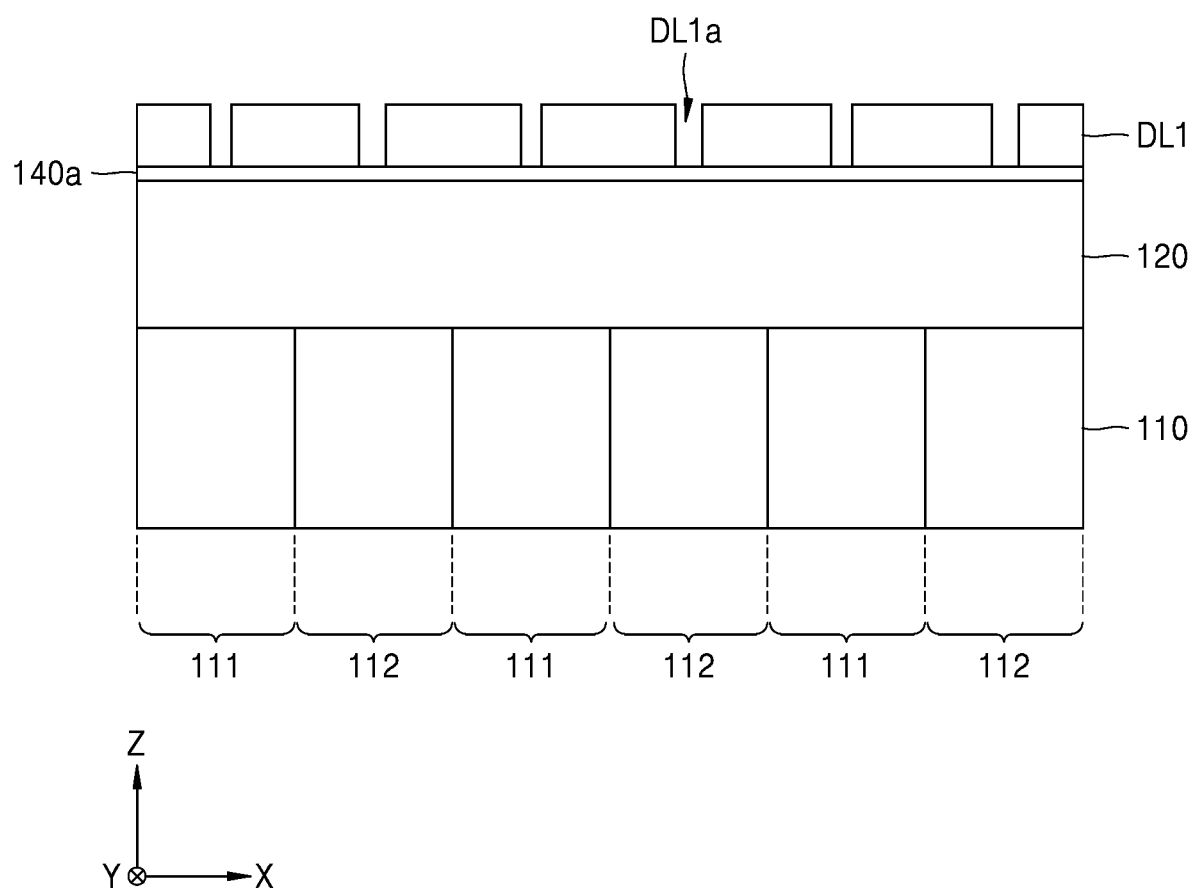

Next, as shown in FIG. 8D, an engraved first pattern DL1a is formed in the first dielectric material layer DL1 through a photolithography process. A photoresist is formed on the first dielectric material layer DL1, is patterned through an exposure process, and then, the first dielectric material layer DL1 that is exposed is removed by an etching process, e.g., a fluorine-based reactive ion etching process, to form the first pattern DL1a. During the etching process of the first dielectric material layer DL1, the first etch prevention layer 140a may prevent damage to the spacer layer 120.

Figure 8E:
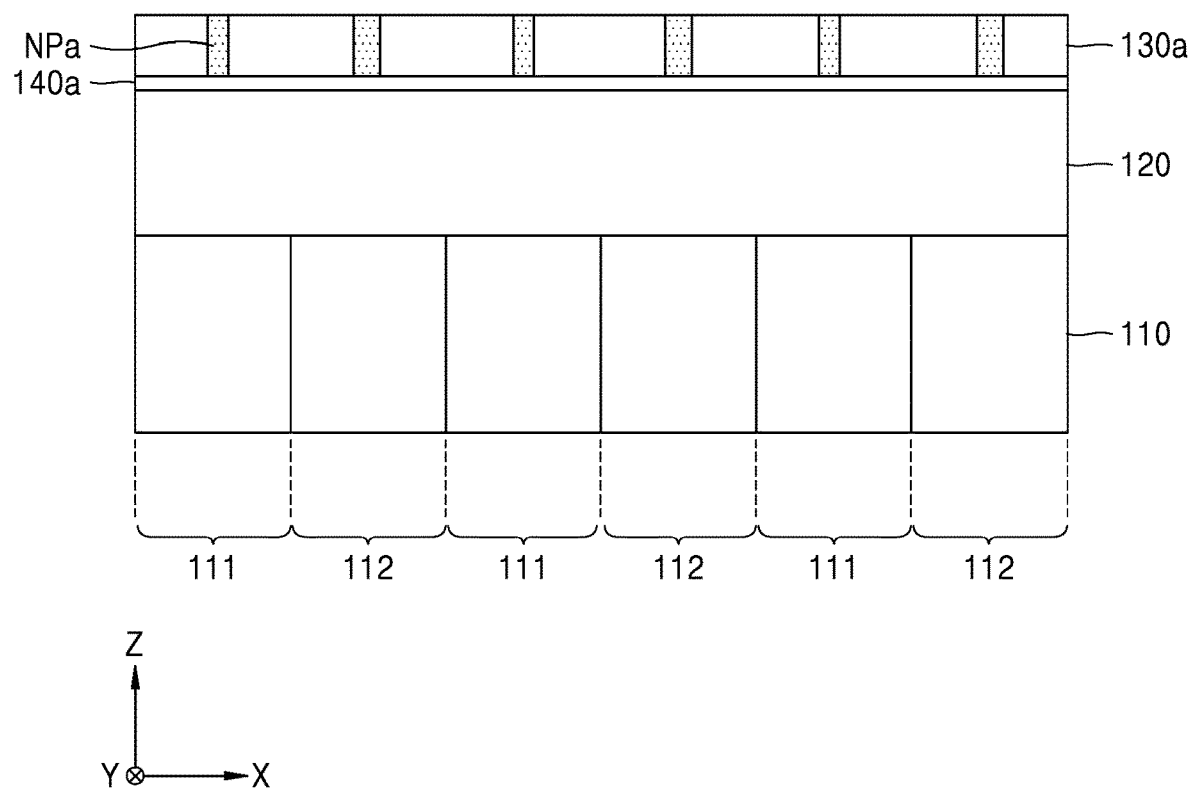

Next, as shown in FIG. 8E, the nanoposts NPa are formed on the first dielectric material layer DL1. A material having different refractive index from that included in the first dielectric material layer DL1, e.g., TiO$_2$, etc. is filled in the first pattern DL1a by using the atomic layer deposition (ALD) method to form the nanoposts NPa, and the material deposited on an upper surface of the first dielectric material layer DL1 may be removed through a chemical mechanical polishing (CMP) process to form the first lens layer 130a.

Figure 8F:
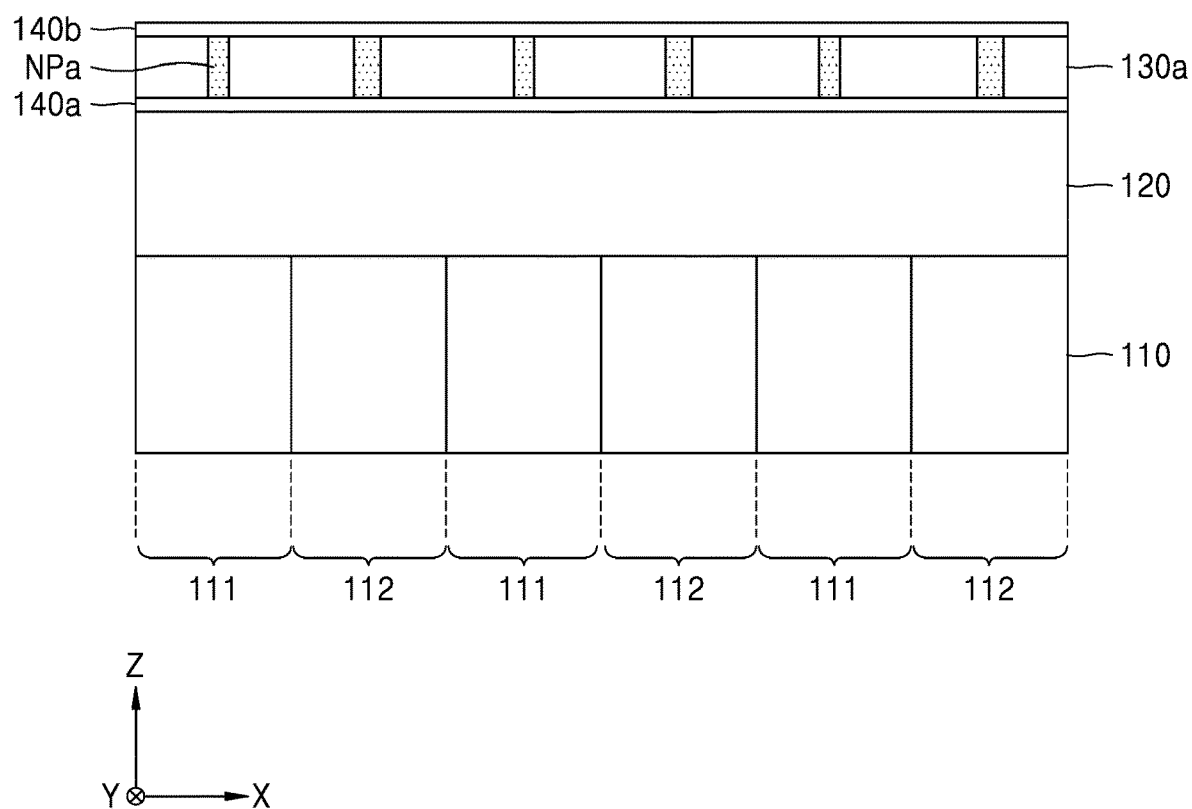
Figure 8G:
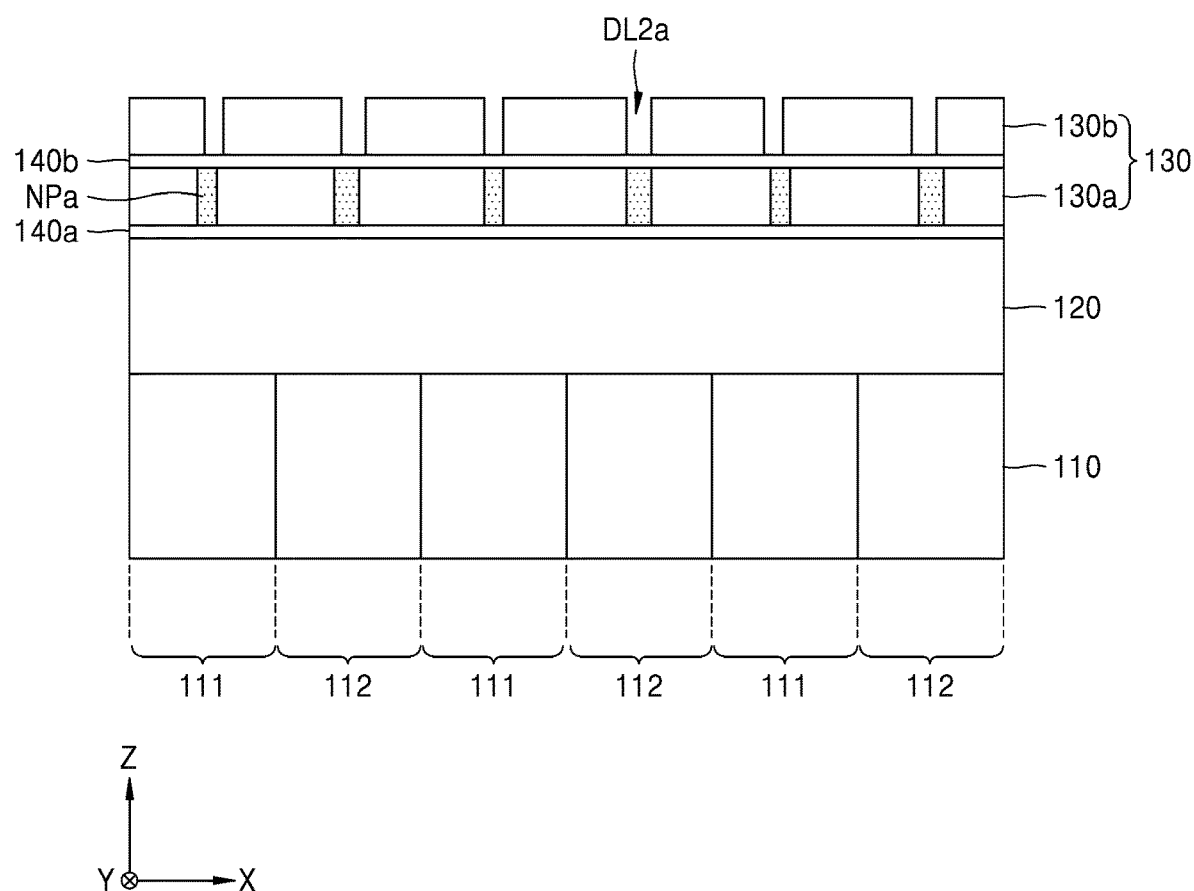
Figure 8H:
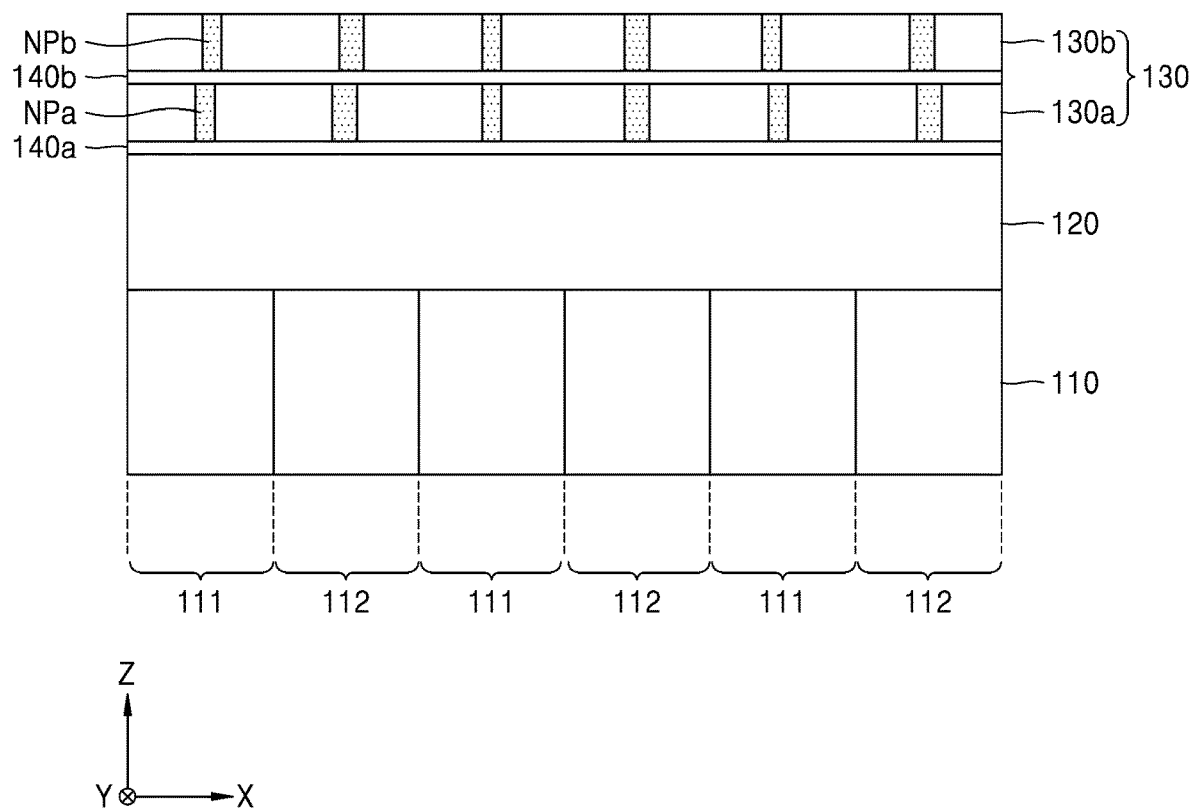

As shown in FIG. 8F, the second etch prevention layer 140b is formed on the first lens layer 130a. Subsequently, the second lens layer 130b may be formed through the processes similar to those of the first lens layer 130a. As shown in FIG. 8G, the second dielectric material layer DL2 is formed on the second etch prevention layer 140b and the second dielectric material layer DL2 is patterned to form the second pattern DL2a. As shown in FIG. 8H, the nanoposts NPb are formed on the second dielectric material layer DL2 to form the second lens layer 130b.

Figure 9A:
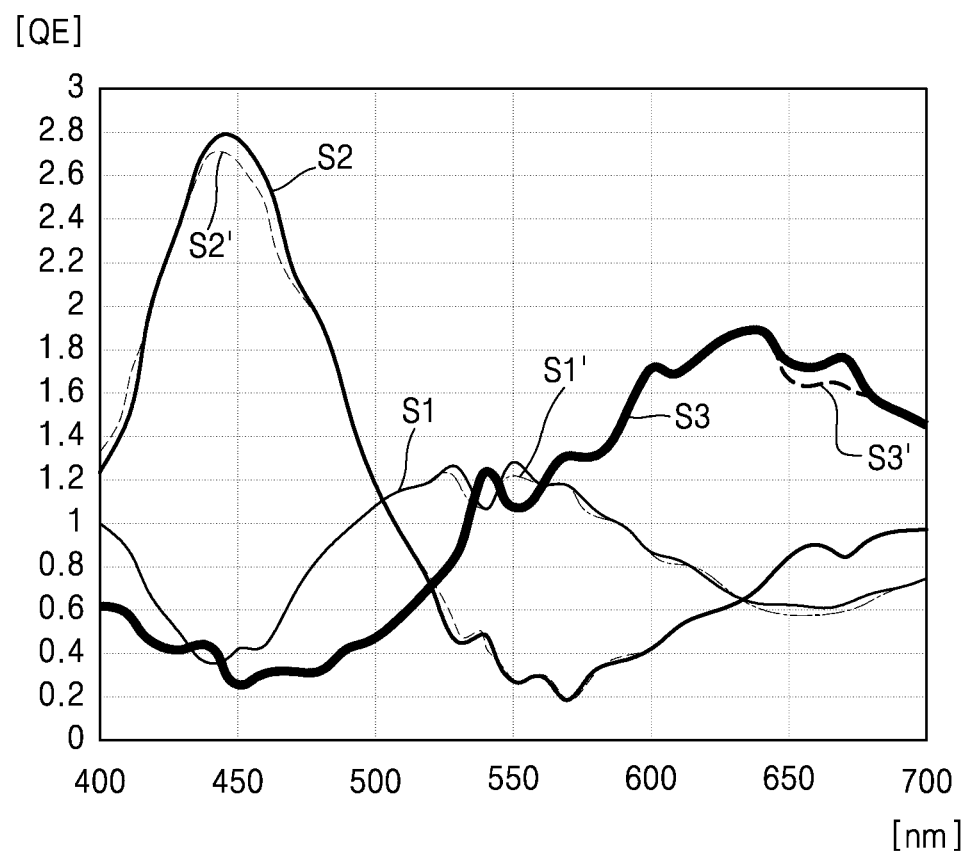
FIGS. 9A and 9B are diagrams showing a variation in a spectrum of light incident on a sensor substrate when a thickness of an etch prevention layer is changed according to an embodiment.
Figure 9B:
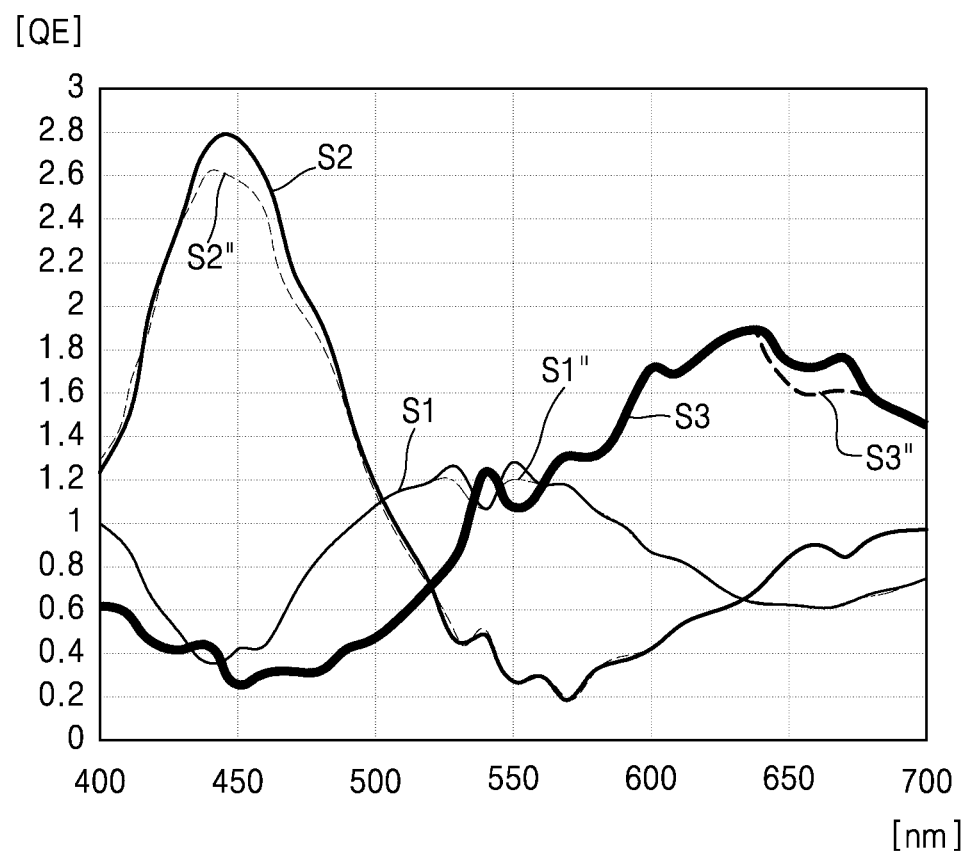

FIGS. 9A and 9B are diagrams showing a variation in a spectrum of light incident on the sensor substrate 110 when a thickness of an etch stop layer is changed.

FIG. 9A shows differences in spectra of light sensed by the sensor substrate 110 when the first and second etch prevention layers 140a and 140b do not exist and when the first and second etch prevention layers 140a and 140b of 10 nm thickness are formed. In FIG. 9A, a first spectrum S1 denotes a spectrum of light sensed by first and fourth photosensitive cells 111 and 114 corresponding to the green pixels G, when the first and second etch prevention layers 140a and 140b are not formed. That is, the first spectrum S1 denotes the spectrum of light that is incident on the pixel array 1100, branched by the color separating lens array 130, and then, sensed by the green pixels 111 and 114, and a wavelength band from 490 nm to 580 nm, e.g., the green light, is the majority. In FIG. 9A, a second spectrum S2 denotes a spectrum of light sensed by the blue pixel 112 when the first and second etch prevention layers 140a and 140b are not formed, and a wavelength band from 420 nm to 475 nm, e.g., the blue light, is the majority. In FIG. 9A, a third spectrum S3 denotes a spectrum of light sensed by the red pixel 113 when the first and second etch prevention layers 140a and 140b are not formed, and a wavelength band from 590 nm to 680 nm, e.g., the red light, is the majority.

A quantum efficiency (QE) denotes a degree of converting photons incident on the pixel array 1100 into electrons due to a photoelectric conversion element, for example, when incident photons are converted into electrons with 80% efficiency, QE is 0.8, and when incident photons are converted into electrons with 100% efficiency, QE is 1.0. In a general pixel array, QE does not exceed 1. However, in the pixel array of FIGS. 4A and 4B that includes the color separating lens array 130, QE may be 1 or greater. For example, when a QE of the blue pixel 112 is 2 with respect to a wavelength of 500 nm, it denotes that electrons corresponding to 200 photons are generated in the blue pixel 112 when the number of photons of the light having 500 nm wavelength traveling toward the blue pixel 112 is 100. In the pixel array 1100 of FIGS. 4A and 4B, photons of the light of 500 nm wavelength, which travels to the first green pixel 111, the red pixel 113, and the second green pixel 114, as well as photons of the light of 500 nm wavelength travelling toward the blue pixel 112, are incident on the blue pixel 112, and thus, QE may be 1 or greater. In other words, the number of photons of the light of 500 nm wavelength that is incident on the blue pixel 112 may be greater than the photons of the light of 500 nm wavelength travelling toward the blue pixel 112 before passing through the color separating lens array 130, and thus, the QE of the blue pixel 112 with respect to the light of 500 nm wavelength may be 1 or greater.

In FIG. 9A, 1'-st to 3'-rd spectra S1', S2', and S3' that are corrected and indicated as dashed lines are spectra of light sensed by the sensor substrate 110 when the first and second etch prevention layers 140a and 140b having 10 nm thickness are included, and show how the first to third spectra S1, S2, and S3 are changed by the first and second etch prevention layers 140a and 140b having 10 nm thickness. Referring to FIG. 9A, QE is reduced due to absorption, reflection, or scattering of light by the first and second etch prevention layers 140a and 140b having 10 nm thickness, and the 2'-nd spectrum S2' having the largest QE decrease ratio at the peak, from among the 1'-st to 3'-rd spectra S1', S2', and S3', shows 3.2% reduced QE as compared with the second spectrum S2 with respect to 440 nm wavelength.

In FIG. 9B, 1"-st to 3"-rd spectra S1", S2", and S3" indicated by dashed lines show modifications to the first to third spectra S1, S2, S3 due to the first and second etch prevention layers 140a and 140b having a 15 nm thickness. The 2"-nd spectrum S2" having the largest QE decrease ratio at the peak has the QE reduced by 6.8% as compared with the second spectrum S2 with respect to 440 nm wavelength.

FIGS. 9A and 9B show that the QE of the sensor substrate may be reduced as the thickness of the etch prevention layer increases, and thus, light utilization efficiency is reduced. However, when the thickness of the etch prevention layer is 2 nm or less, the etch prevention function may be degraded, and thus, the etch prevention layer may have a thickness of about 3 nm to 30 nm, or a thickness of about 5 nm to about 15 nm.

Figure 10A:
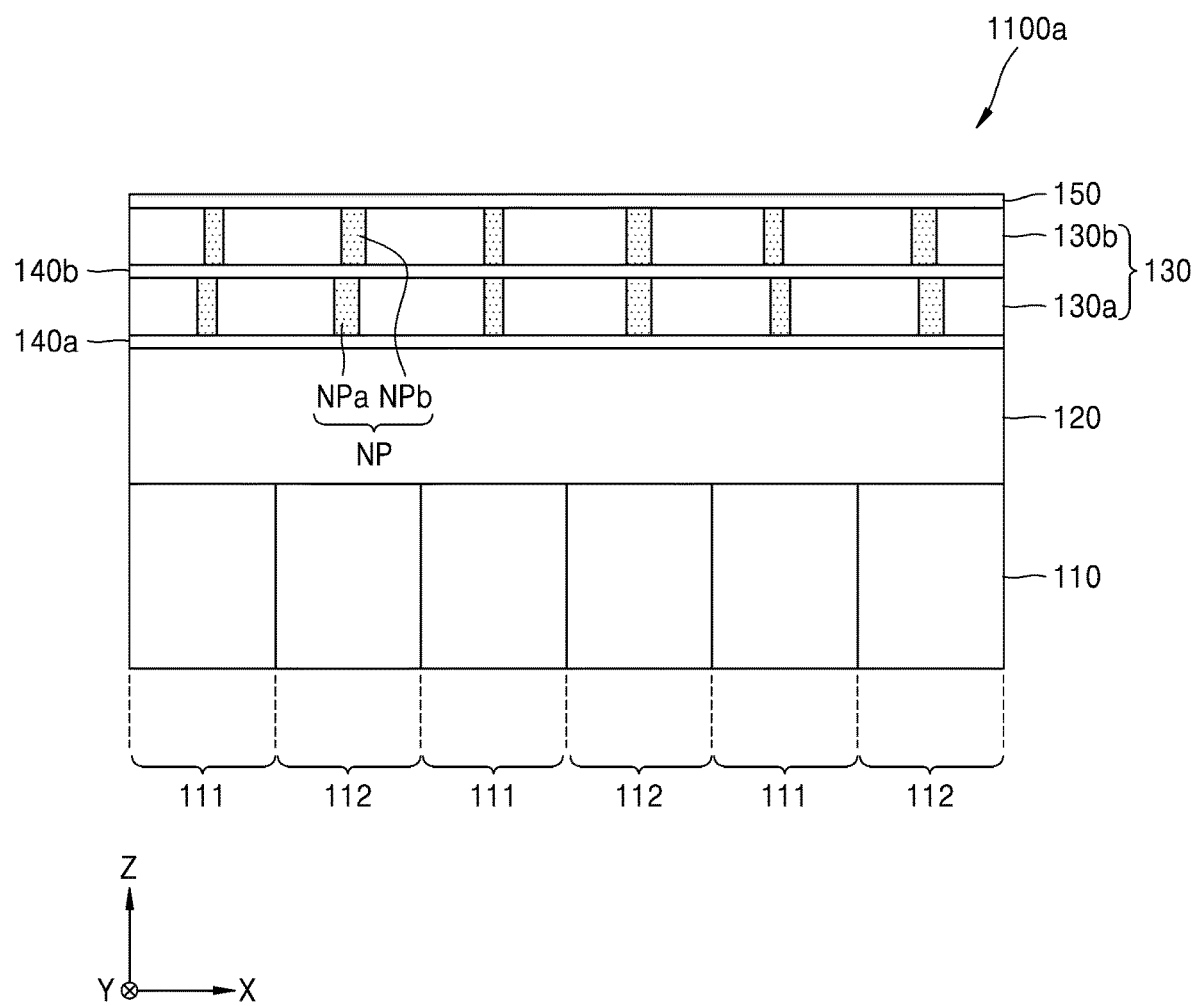
FIGS. 10A and 10B are cross-sectional views of a pixel array further including an anti-reflection layer on a color separating lens array according to an embodiment.
Figure 10B:
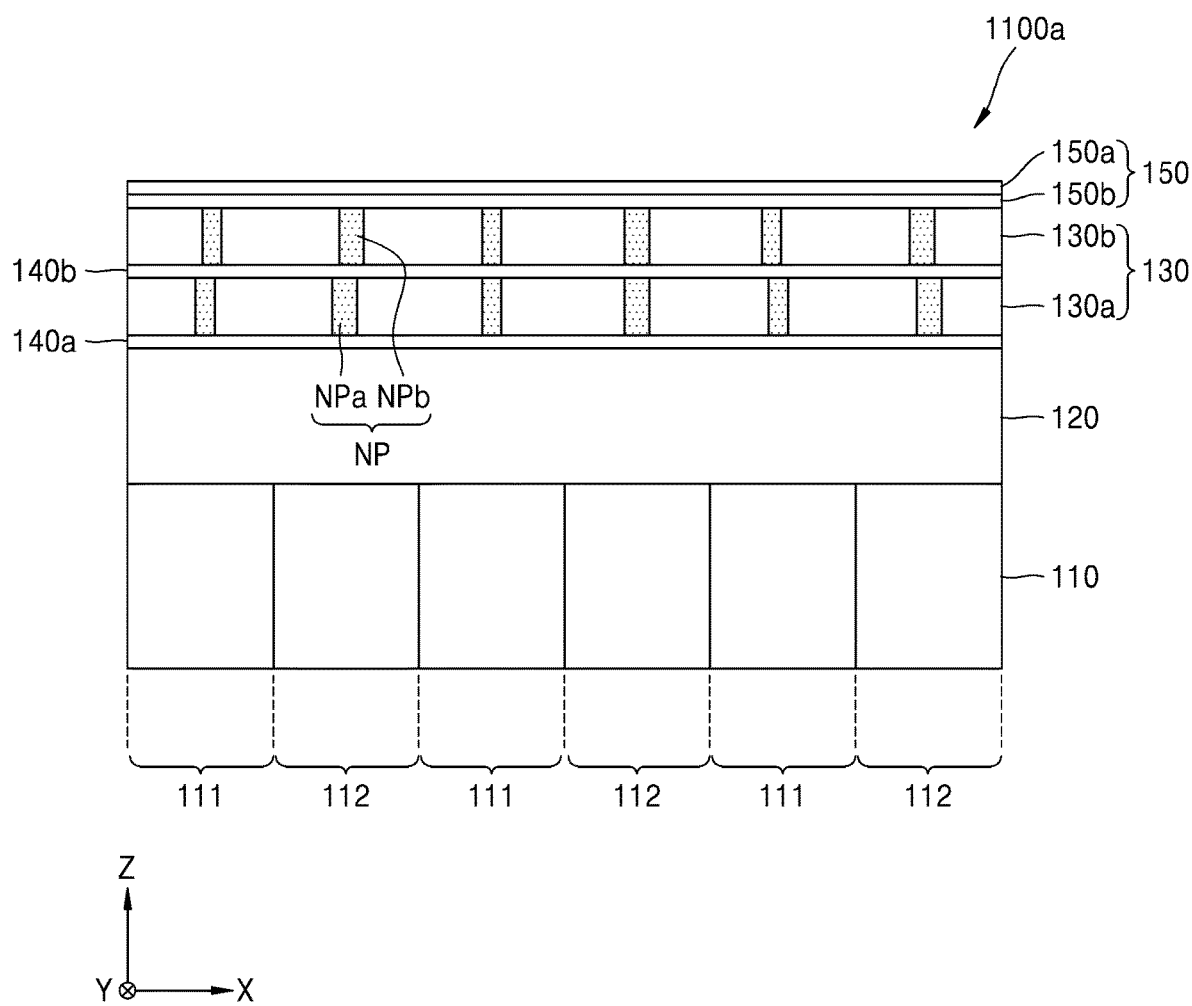

FIGS. 10A and 10B are cross-sectional views of a pixel array 1100a further including an anti-reflection layer 150 on the color separating lens array 130.

Referring to FIGS. 10A and 10B, the anti-reflection layer 150 is formed on the color separating lens array 130, and reduces the light, in the incident light, reflected from the upper surface of the color separating lens array 130 and improves the light utilization efficiency of the pixel array 1100a. In other words, the anti-reflection layer 150 allows the light incident from outside on the pixel array 1100a not to be reflected from the upper surface of the color separating lens array 130, but to pass through the color separating lens array 130 and be sensed by the sensor substrate 110.

The anti-reflection layer 150 may have a structure in which one or more layers are stacked, and as shown in FIG. 10A, the anti-reflection layer 150 may include a single layer including a material, e.g., $SiO_2$, having a refractive index that is different from that of the material included in the nanoposts NPa and NPb. The anti-reflection layer 150 may have a thickness of about 80 nm to about 120 nm. Also, the anti-reflection layer 150 may include first and second anti-reflection layers 150a and 150b stacked vertically, as shown in FIG. 10B. The first anti-reflection layer 150a may include, for example, a $SiO_2$ layer having a thickness of about 80 nm to about 120 nm. The second anti-reflection layer 150b may include, for example, a $Si_3N_4$ layer having a thickness of about 20 nm to about 60 nm.

Figure 11A:
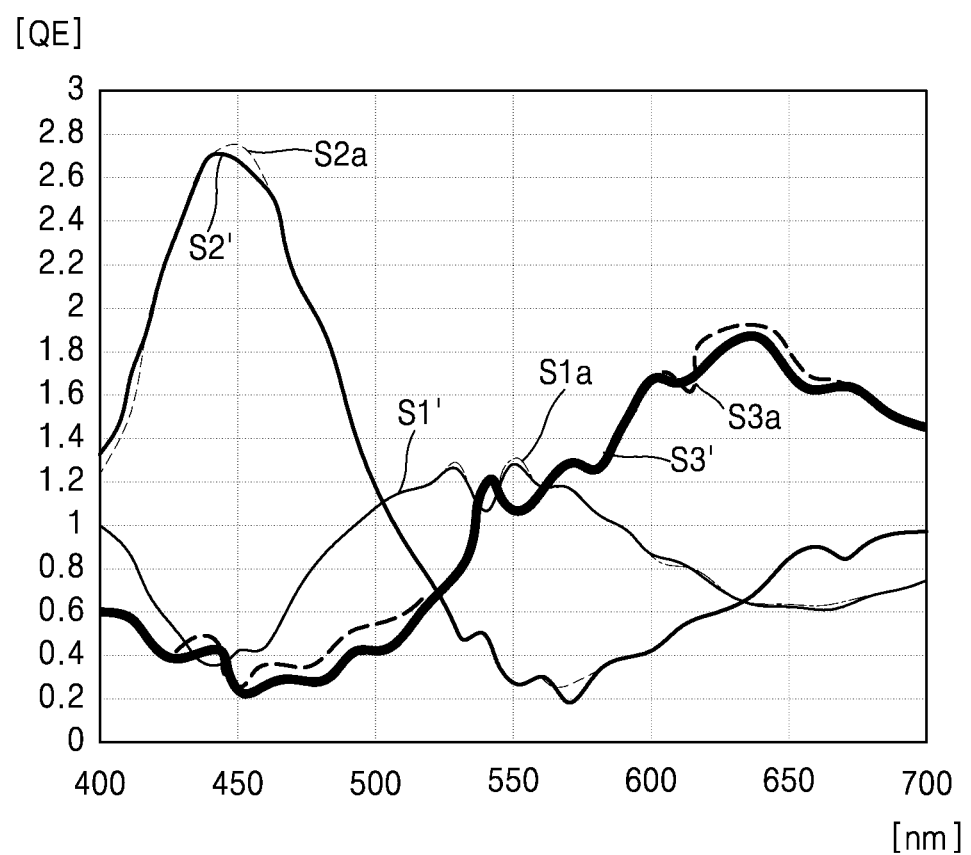
FIGS. 11A and 11B are diagrams for illustrating a variation in a spectrum of light incident on a sensor substrate due to an anti-reflection layer according to an embodiment.
Figure 11B:
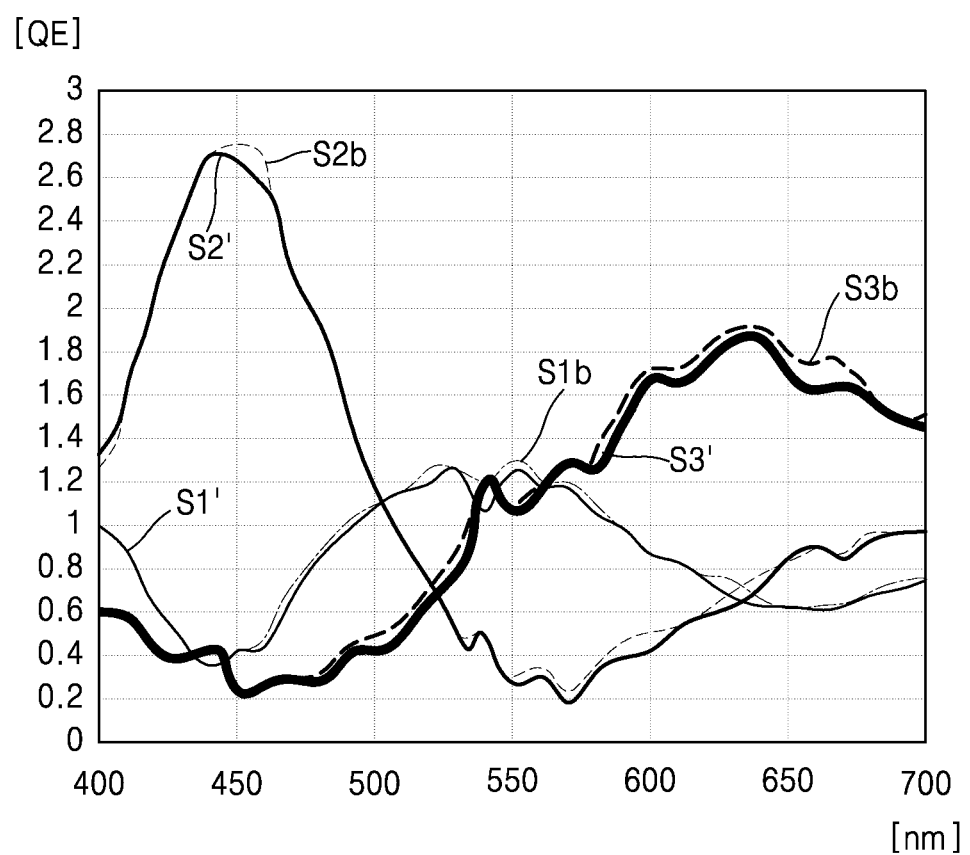

FIGS. 11A and 11B are diagrams for illustrating a variation in a spectrum of light incident on a sensor substrate due to an anti-reflection layer.

FIG. 11A shows 1a-th to 3a-th spectra S1a, S2a, and S3a that are changed from the corrected spectra S1', S2', and S3' of FIG. 9A due to one $SiO_2$ anti-reflection layer 150 having a thickness of 100 nm as shown in FIG. 10A. Referring to FIG. 11A, from among the changed 1a-th to 3a-th spectra S1a, S2a, and S3a, the 2a-th spectrum S2a has the largest increase ratio at the peak, for example, has a QE increased by 0.86% as compared with the 2'-nd spectrum S2' with respect to the 440 nm wavelength.

FIG. 11B shows spectra S1b, S2b, and S3b that are changed from the corrected spectra S1', S2', and S3' of FIG. 9A due to the first anti-reflection layer 150a including $SiO_2$ of a thickness of 100 nm and a second anti-reflection layer 150b including $Si_3N_4$ of a thickness of 40 nm shown in FIG. 10B. Referring to FIG. 11B, from among the changed spectra S1b, S2b, and S3b, the 2b-th spectrum S2b has the largest QE increase ratio at the peak, for example, has a QE increased by 2.37% as compared with the 2'-nd spectrum S2' with respect to the 440 nm wavelength.

FIGS. 11A and 11B show that the light utilization efficiency of the pixel array may be improved by using the anti-reflection layer.

According to the image sensor 1000 including the pixel array 1100 described above, light loss due to a color filter, e.g., an organic color filter, rarely occurs, and thus, a sufficient amount of light may be provided to the pixels even when the pixels become smaller. Therefore, an ultra-high resolution, ultra-small, and highly sensitive image sensor having hundreds of millions of pixels or more may be manufactured. Such an ultra-high resolution, ultra-small, and highly sensitive image sensor may be employed in various high-performance optical devices or high-performance electronic apparatuses. The electronic apparatuses may include, for example, smartphones, mobile phones, cell phones, personal digital assistants (PDAs), laptop computers, personal computers (PCs), a variety of portable devices, electronic apparatuses, surveillance cameras, medical camera, automobiles, Internet of Things (IoT) devices, other mobile or non-mobile computing devices and are not limited thereto.

The electronic apparatuses may further include, in addition to the image sensor 1000, a processor for controlling the image sensor, for example, an application processor (AP), and may control a plurality of hardware or software elements and may perform various data processes and operations by driving an operation system or application programs via the processor. The processor may further include a graphic processing unit (GPU) and/or an image signal processor. When an image signal processor is included in the processor, an image (or video) obtained by the image sensor may be stored and/or output by using the processor.

Figure 12:
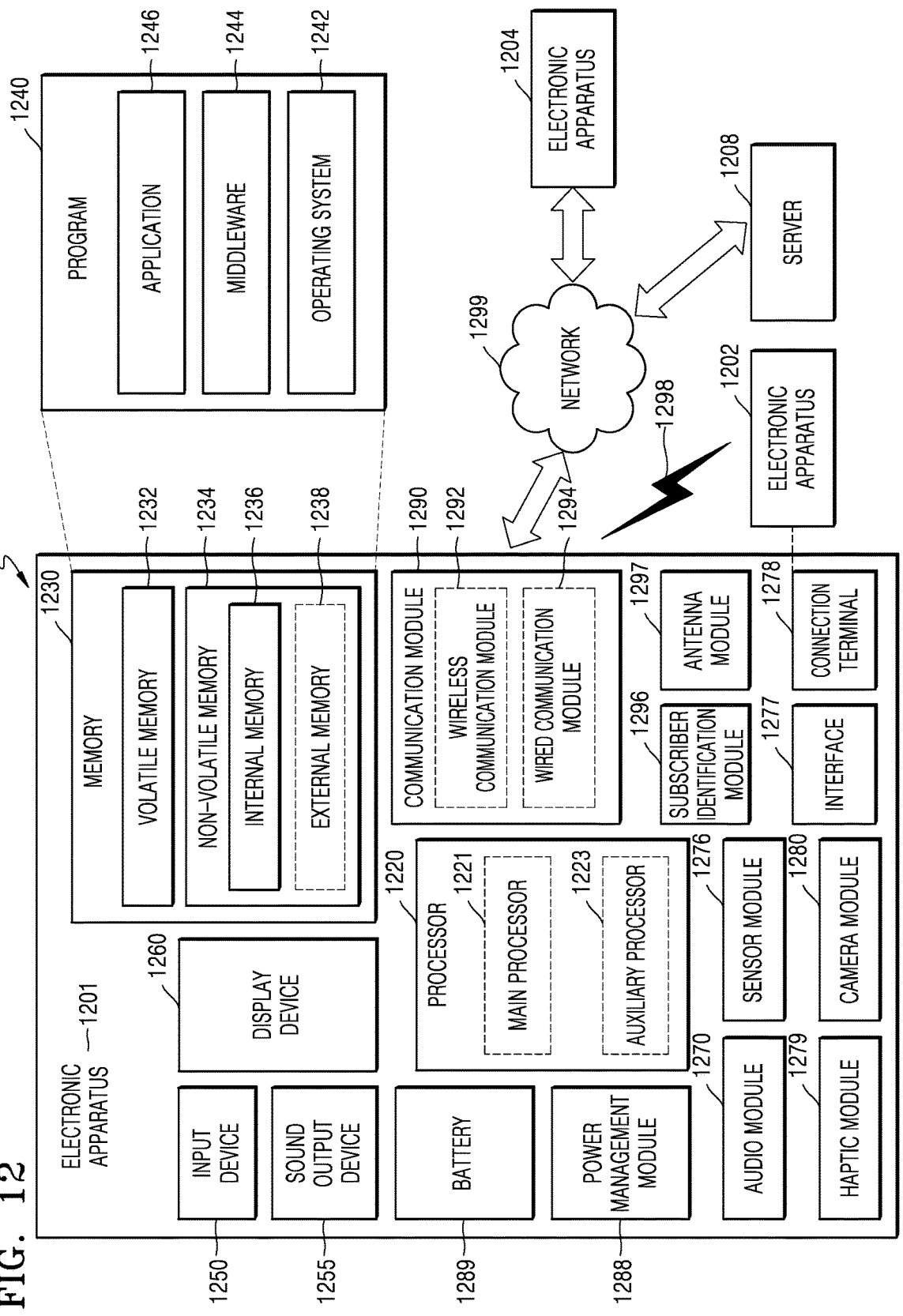
FIG. 12 is a block diagram of an electronic apparatus including an image sensor according to one or more embodiments.

FIG. 12 is a block diagram showing an example of an electronic apparatus 1201 including the image sensor 1000. Referring to FIG. 12, in a network environment 1200, the electronic apparatus 1201 may communicate with another electronic apparatus 1202 via a first network 1298 (e.g., short-range wireless communication network, etc.), or may communicate with another electronic apparatus 1204 and/or a server 1208 via a second network 1299 (e.g., long-range wireless communication network, etc.) The electronic apparatus 1201 may communicate with the electronic apparatus 1204 via the server 1208. The electronic apparatus 1201 may include a processor 1220, a memory 1230, an input device 1250, a sound output device 1255, a display device 1260, an audio module 1270, a sensor module 1276, an interface 1277, a haptic module 1279, a camera module 1280, a power management module 1288, a battery 1289, a communication module 1290, a subscriber identification module 1296, and/or an antenna module 1297. In the electronic apparatus 1201, some (e.g., display device 1260, etc.) of the elements may be omitted or another element may be added. Some of the elements may be configured as one integrated circuit. For example, the sensor module 1276 (e.g., a fingerprint sensor, an iris sensor, an illuminance sensor, etc.) may be embedded and implemented in the display device 1260 (e.g., display, etc.).

The processor 1220 may control one or more elements (e.g., hardware, software elements, etc.) of the electronic apparatus 1201 connected to the processor 1220 by executing software (e.g., program 1240, etc.), and may perform various data processes or operations. As a part of the data processing or operations, the processor 1220 may load a command and/or data received from another element (e.g., sensor module 1276, communication module 1290, etc.) to a volatile memory 1232, may process the command and/or data stored in the volatile memory 1232, and may store result data in a non-volatile memory 1234. The processor 1220 may include a main processor 1221 (e.g., central processing unit, application processor, etc.) and an auxiliary processor 1223 (e.g., graphic processing unit, image signal processor, sensor hub processor, communication processor, etc.) that may be operated independently from or along with the main processor 1221. The auxiliary processor 1223 may use less power than that of the main processor 1221, and may perform specified functions.

The auxiliary processor 1223, on behalf of the main processor 1221 while the main processor 1221 is in an inactive state (e.g., sleep state) or along with the main processor 1221 while the main processor 1221 is in an active state (e.g., application executed state), may control functions and/or states related to some (e.g., display device 1260, sensor module 1276, communication module 1290, etc.) of the elements in the electronic apparatus 1201. The auxiliary processor 1223 (e.g., image signal processor, communication processor, etc.) may be implemented as a part of another element (e.g., camera module 1280, communication module 1290, etc.) that is functionally related thereto.

The memory 1230 may store various data required by the elements (e.g., processor 1220, sensor module 1276, etc.) of the electronic apparatus 1201. The data may include, for example, input data and/or output data about software (e.g., program 1240, etc.) and commands related thereto. The memory 1230 may include the volatile memory 1232 and/or the non-volatile memory 1234. The non-volatile memory 1234 may include an internal memory 1236 fixedly installed in the electronic apparatus 1201, and an external memory 1238 that is detachable.

The program 1240 may be stored as software in the memory 1230, and may include an operation system 1242, middleware 1244, and/or an application 1246.

The input device 1250 may receive commands and/or data to be used in the elements (e.g., processor 1220, etc.) of the electronic apparatus 1201, from outside (e.g., a user, etc.) of the electronic apparatus 1201. The input device 1250 may include a microphone, a mouse, a keyboard, and/or a digital pen (e.g., stylus pen).

The sound output device 1255 may output a sound signal to outside of the electronic apparatus 1201. The sound output device 1255 may include a speaker and/or a receiver. The speaker may be used for a general purpose such as multimedia reproduction or record play, and the receiver may be used to receive a call. The receiver may be coupled as a part of the speaker or may be implemented as an independent device.

The display device 1260 may provide visual information to outside of the electronic apparatus 1201. The display device 1260 may include a display, a hologram device, or a projector, and a control circuit for controlling the corresponding device. The display device 1260 may include a touch circuitry set to sense a touch, and/or a sensor circuit (e.g., pressure sensor, etc.) that is set to measure a strength of a force generated by the touch.

The audio module 1270 may convert sound into an electrical signal or vice versa. The audio module 1270 may acquire sound through the input device 1250, or may output sound via the sound output device 1255 and/or a speaker and/or a headphone of another electronic apparatus (e.g., electronic apparatus 1202, etc.) connected directly or wirelessly to the electronic apparatus 1201.

The sensor module 1276 may sense an operating state (e.g., power, temperature, etc.) of the electronic apparatus 1201, or an outer environmental state (e.g., user state, etc.), and may generate an electrical signal and/or data value corresponding to the sensed state. The sensor module 1276 may include a gesture sensor, a gyro-sensor, a pressure sensor, a magnetic sensor, an acceleration sensor, a grip sensor, a proximity sensor, a color sensor, an infrared (IR) ray sensor, a vivo sensor, a temperature sensor, a humidity sensor, and/or an illuminance sensor.

The interface 1277 may support one or more designated protocols that may be used in order for the electronic apparatus 1201 to be directly or wirelessly connected to another electronic apparatus (e.g., electronic apparatus 1202, etc.) The interface 1277 may include a high-definition multimedia interface (HDMI), a universal serial bus (USB) interface, an SD card interface, and/or an audio interface.

The connection terminal 1278 may include a connector by which the electronic apparatus 1201 may be physically connected to another electronic apparatus (e.g., electronic apparatus 1202, etc.). The connection terminal 1278 may include an HDMI connector, a USB connector, an SD card connector, and/or an audio connector (e.g., headphone connector, etc.).

The haptic module 1279 may convert the electrical signal into a mechanical stimulation (e.g., vibration, motion, etc.) or an electric stimulation that the user may sense through a tactile or motion sensation. The haptic module 1279 may include a motor, a piezoelectric device, and/or an electric stimulus device.

The camera module 1280 may capture a still image and a video. The camera module 1280 may include a lens assembly including one or more lenses, the image sensor 1000 of FIG. 1, image signal processors, and/or flashes. The lens assembly included in the camera module 1280 may collect light emitted from an object to be captured.

The power management module 1288 may manage the power supplied to the electronic apparatus 1201. The power management module 1288 may be implemented as a part of a power management integrated circuit (PMIC).

The battery 1289 may supply electric power to components of the electronic apparatus 1201. The battery 1289 may include a primary battery that is not rechargeable, a secondary battery that is rechargeable, and/or a fuel cell.

The communication module 1290 may support the establishment of a direct (wired) communication channel and/or a wireless communication channel between the electronic apparatus 1201 and another electronic apparatus (e.g., electronic apparatus 1202, electronic apparatus 1204, server 1208, etc.), and execution of communication through the established communication channel. The communication module 1290 may be operated independently from the processor 1220 (e.g., application processor, etc.), and may include one or more communication processors that support the direct communication and/or the wireless communication. The communication module 1290 may include a wireless communication module 1292 (e.g., cellular communication module, a short-range wireless communication module, a global navigation satellite system (GNSS) communication module) and/or a wired communication module 1294 (e.g., local area network (LAN) communication module, a power line communication module, etc.). From among the communication modules, a corresponding communication module may communicate with another electronic apparatus via a first network 1298 (e.g., short-range communication network such as Bluetooth, WiFi direct, or infrared data association (IrDA)) or a second network 1299 (e.g., long-range communication network such as a cellular network, Internet, or computer network (LAN, WAN, etc.)). Such above various kinds of communication modules may be integrated as one element (e.g., single chip, etc.) or may be implemented as a plurality of elements (e.g., a plurality of chips) separately from one another. The wireless communication module 1292 may identify and authenticate the electronic apparatus 1201 in a communication network such as the first network 1298 and/or the second network 1299 by using subscriber information (e.g., international mobile subscriber identifier (IMSI), etc.) stored in the subscriber identification module 1296.

The antenna module 1297 may transmit or receive the signal and/or power to/from outside (e.g., another electronic apparatus, etc.). An antenna may include a radiator formed as a conductive pattern formed on a substrate (e.g., printed circuit board (PCB), etc.). The antenna module 1297 may include one or more antennas. When the antenna module 1297 includes a plurality of antennas, from among the plurality of antennas, an antenna that is suitable for the communication type used in the communication network such as the first network 1298 and/or the second network 1299 may be selected by the communication module 1290. The signal and/or the power may be transmitted between the communication module 1290 and another electronic apparatus via the selected antenna. Another component (e.g., radio-frequency integrated circuit (RFIC), etc.) other than the antenna may be included as a part of the antenna module 1297.

Some of the elements may be connected to one another via the communication method among the peripheral devices (e.g., bus, general purpose input and output (GPIO), serial peripheral interface (SPI), mobile industry processor interface (MIPI), etc.) and may exchange signals (e.g., commands, data, etc.).

The command or data may be transmitted or received between the electronic apparatus 1201 and the external electronic apparatus 1204 via the server 1208 connected to the second network 1299. Other electronic apparatuses 1202 and 1204 may be the devices that are the same as or different kinds from the electronic apparatus 1201. All or some of the operations executed in the electronic apparatus 1201 may be executed in one or more devices among the other electronic apparatuses 1202, 1204, and 1208. For example, when the electronic apparatus 1201 needs to perform a certain function or service, the electronic apparatus 1401 may request one or more other electronic apparatuses to perform some or entire function or service, instead of executing the function or service by itself. One or more electronic apparatuses receiving the request execute an additional function or service related to the request and may transmits a result of the execution to the electronic apparatus 1201. To do this, for example, a cloud computing, a distributed computing, or a client-server computing technique may be used.

Figure 13:
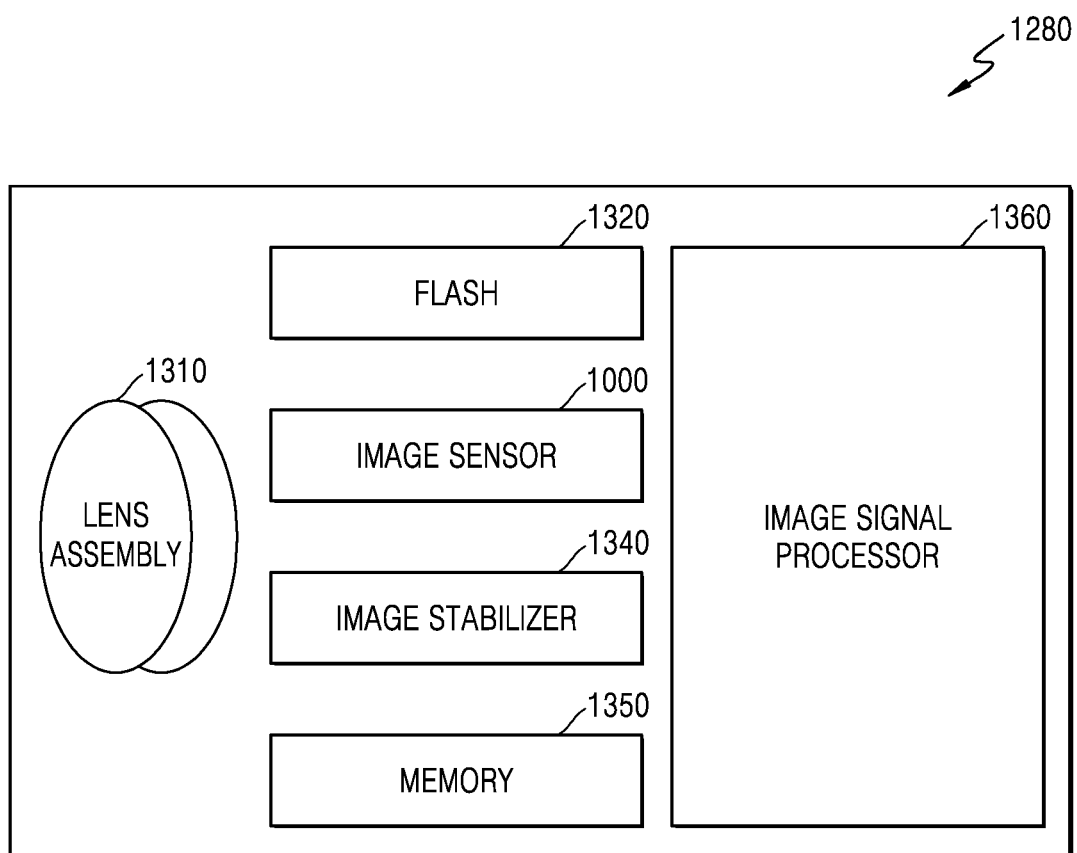
FIG. 13 is a block diagram of a camera module in FIG. 12.

FIG. 13 is a block diagram showing the camera module 1280 of FIG. 12. Referring to FIG. 13, the camera module 1280 may include a lens assembly 1310, a flash 1320, an image sensor 1000 (e.g., the image sensor 1000 of FIG. 1), an image stabilizer 1340, a memory 1350 (e.g., buffer memory, etc.), and/or an image signal processor 1360. The lens assembly 1310 may collect light emitted from an object to be captured. The camera module 1280 may include a plurality of lens assemblies 1310, and in this case, the camera module 1280 may include, for example, a dual camera module, a 360-degree camera, or a spherical camera. Some of the plurality of lens assemblies 1310 may have the same lens properties (e.g., viewing angle, focal distance, auto-focus, F number, optical zoom, etc.) or different lens properties. The lens assembly 1310 may include a wide-angle lens or a telephoto lens.

The flash 1320 may emit light that is used to strengthen the light emitted or reflected from the object. The flash 1320 may include one or more light-emitting diodes (e.g., red-green-blue (RGB) LED, white LED, infrared LED, ultraviolet LED, etc.), and/or a Xenon lamp. The image sensor 1000 may be the image sensor described above with reference to FIG. 1, and converts the light emitted or reflected from the object and transmitted through the lens assembly 1310 into an electrical signal to obtain an image corresponding to the object. The image sensor 1000 may include one or more selected sensors from among image sensors having different properties such as an RGB sensor, a black-and-white (BW) sensor, an IR sensor, and a UV sensor. Each of the sensors included in the image sensor 1000 may be implemented as a charge-coupled device (CCD) sensor and/or a complementary metal oxide semiconductor (CMOS) sensor.

The image stabilizer 1340, in response to a motion of the camera module 1280 or the electronic apparatus 1301 including the camera module 1280, moves one or more lenses included in the lens assembly 1310 or the image sensor 1000 in a certain direction or controls the operating characteristics of the image sensor 1000 (e.g., adjusting of a read-out timing, etc.) in order to compensate for a negative influence of the motion. The image stabilizer 1340 may sense the movement of the camera module 1280 or the electronic apparatus 1201 by using a gyro sensor (not shown) or an acceleration sensor (not shown) arranged in or out of the camera module 1280. The image stabilizer 1340 may be implemented as an optical type.

The memory 1350 may store some or entire data of the image obtained through the image sensor 1000 for next image processing operation. For example, when a plurality of images are obtained at a high speed, obtained original data (e.g., Bayer-patterned data, high resolution data, etc.) is stored in the memory 1350, and a low resolution image is only displayed. Then, original data of a selected image (e.g., user selection, etc.) may be transmitted to the image signal processor 1360. The memory 1350 may be integrated with the memory 1230 of the electronic apparatus 1201, or may include an additional memory that is operated independently.

The image signal processor 1360 may perform image treatment on the image obtained through the image sensor 1000 or the image data stored in the memory 1350. The image treatments may include, for example, a depth map generation, a three-dimensional modeling, a panorama generation, extraction of features, an image combination, and/or an image compensation (e.g., noise reduction, resolution adjustment, brightness adjustment, blurring, sharpening, softening, etc.). The image signal processor 1360 may perform controlling (e.g., exposure time control, read-out timing control, etc.) of the elements (e.g., image sensor 1000, etc.) included in the camera module 1280. The image processed by the image signal processor 1360 may be stored again in the memory 1350 for additional process, or may be provided to an external element of the camera module 1280 (e.g., the memory 1230, the display device 1260, the electronic apparatus 1202, the electronic apparatus 1204, the server 1208, etc.). The image signal processor 1360 may be integrated with the processor 1220, or may be configured as an additional processor that is independently operated from the processor 1220. When the image signal processor 1360 is configured as an additional processor separately from the processor 1220, the image processed by the image signal processor 1360 undergoes through an additional image treatment by the processor 1220 and then may be displayed on the display device 1260.

The electronic apparatus 1201 may include a plurality of camera modules 1280 having different properties or functions. In this case, one of the plurality of camera modules 1280 may include a wide-angle camera and another camera module may include a telephoto camera. Similarly, one of the plurality of camera modules 1280 may include a front camera and another camera module 1280 may include a rear camera.

Figure 14:
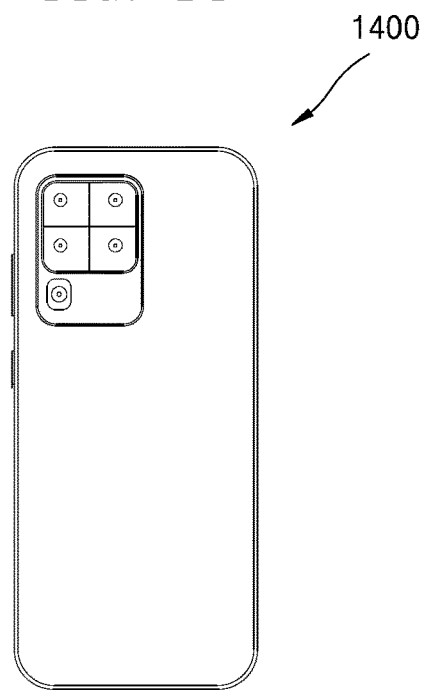
FIGS. 14 to 23 are diagrams showing various examples of an electronic apparatus to which an image sensor according to one or more embodiments is applied.
Figure 15:
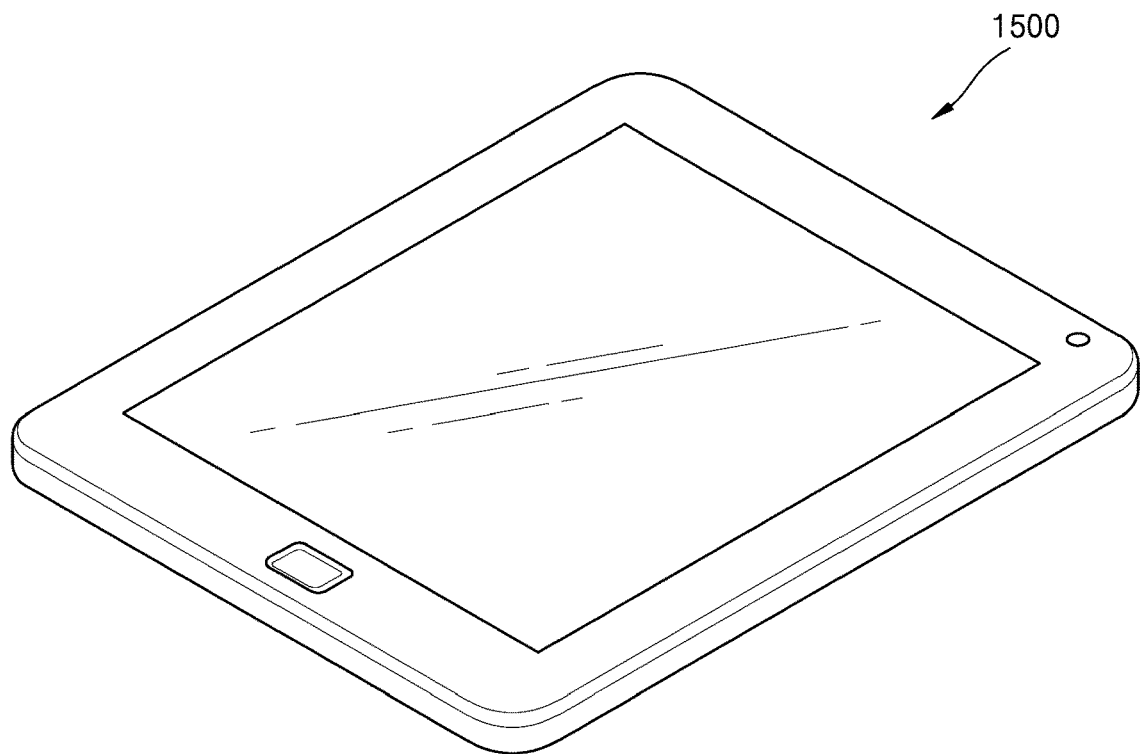
Figure 16:
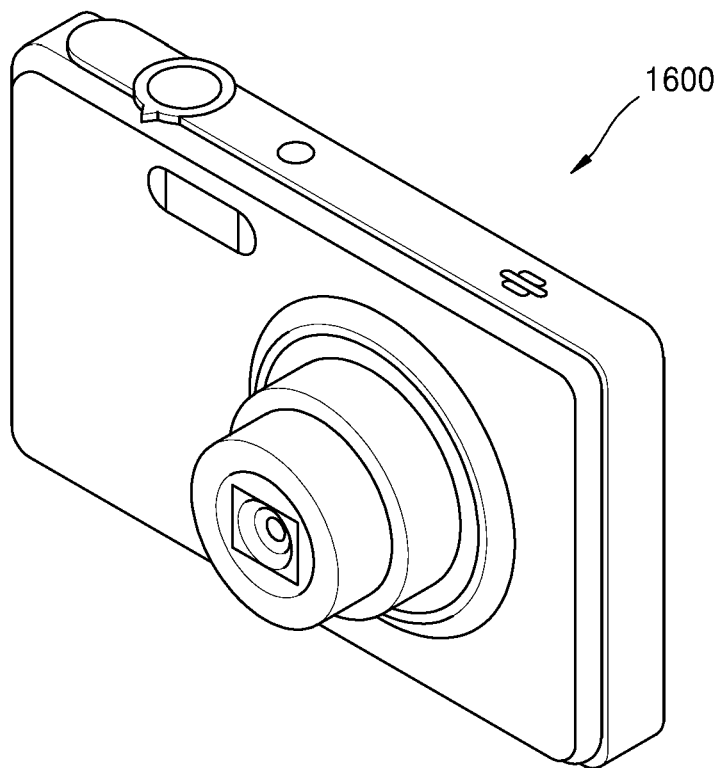
Figure 17:
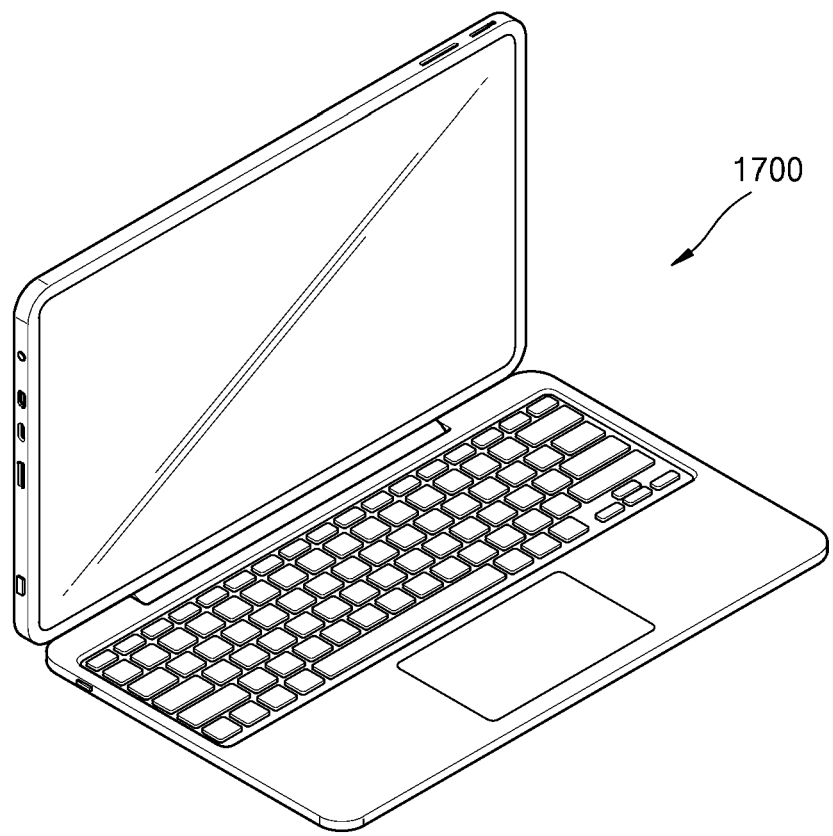
Figure 18:
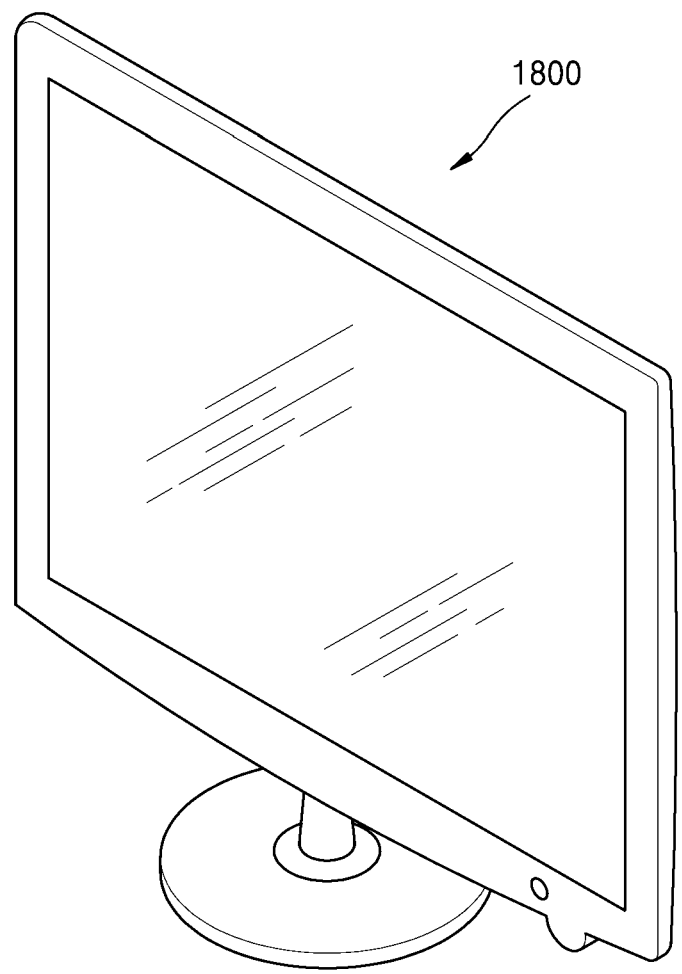

The image sensor 1000 according to the embodiments may be applied to a mobile phone or a smartphone 1400 shown in FIG. 14, a tablet or a smart tablet 1500 shown in FIG. 15, a digital camera or a camcorder 1600 shown in FIG. 16, a laptop computer 1700 shown in FIG. 17, or a television or a smart television 1800 shown in FIG. 18. For example, the smartphone 1400 or the smart tablet 1500 may include a plurality of high-resolution cameras each including a high-resolution image sensor. Depth information of objects in an image may be extracted, out focusing of the image may be adjusted, or objects in the image may be automatically identified by using the high-resolution cameras.

Figure 19:
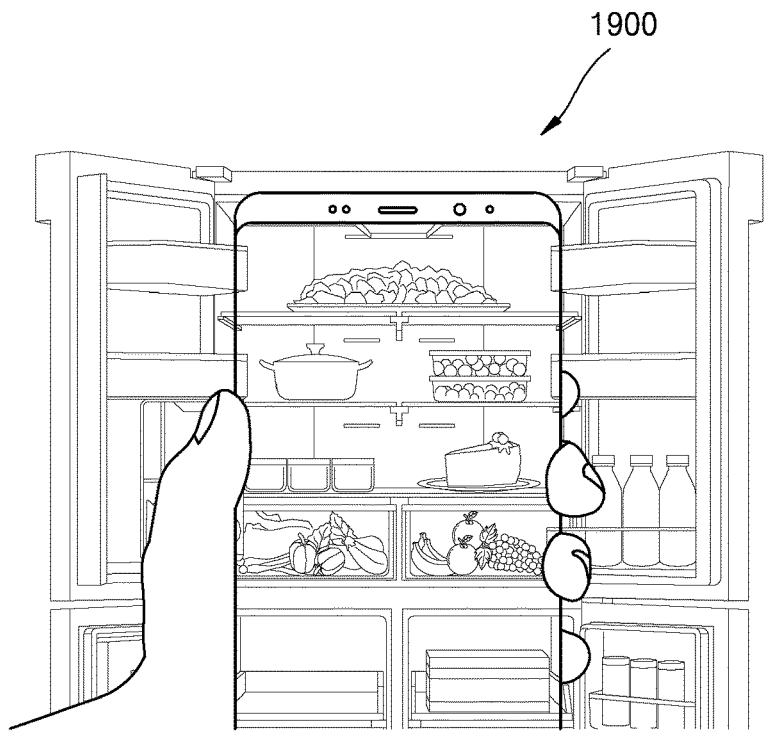
Figure 20:
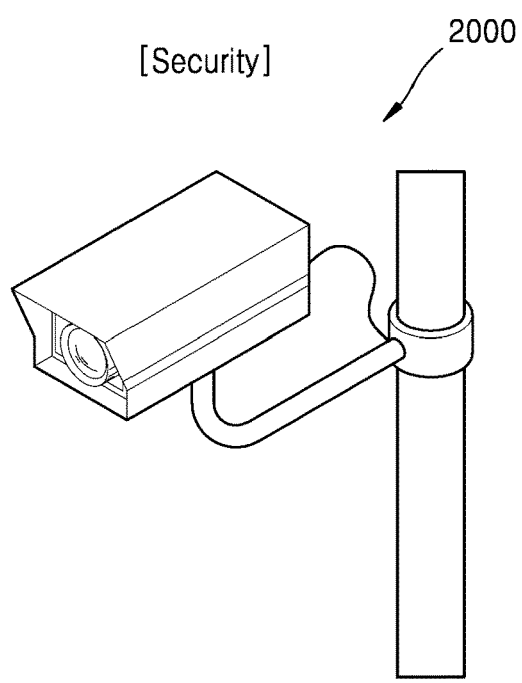
Figure 21:
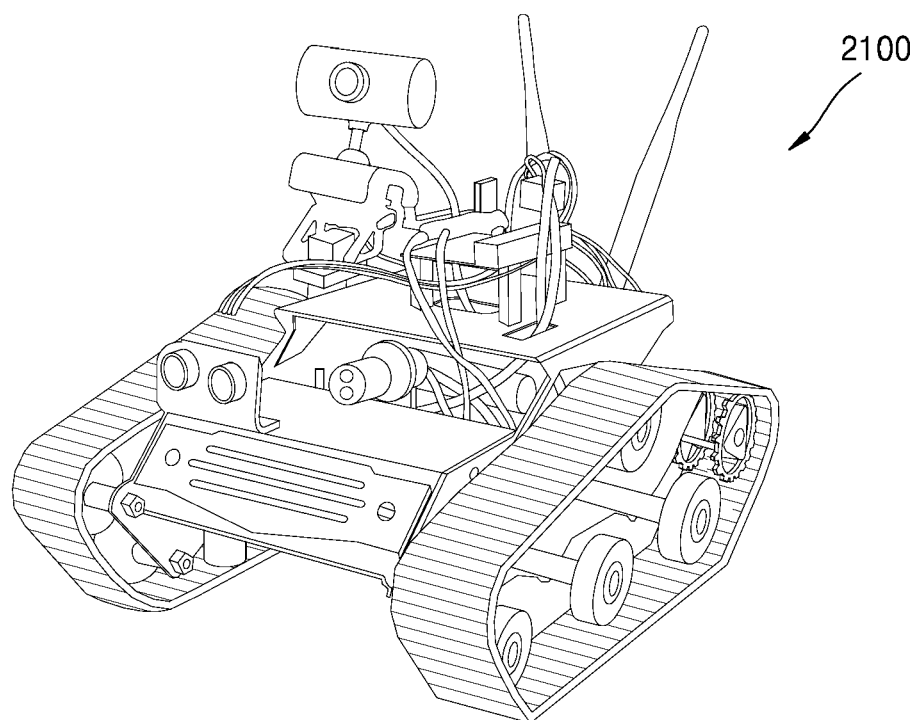
Figure 22:
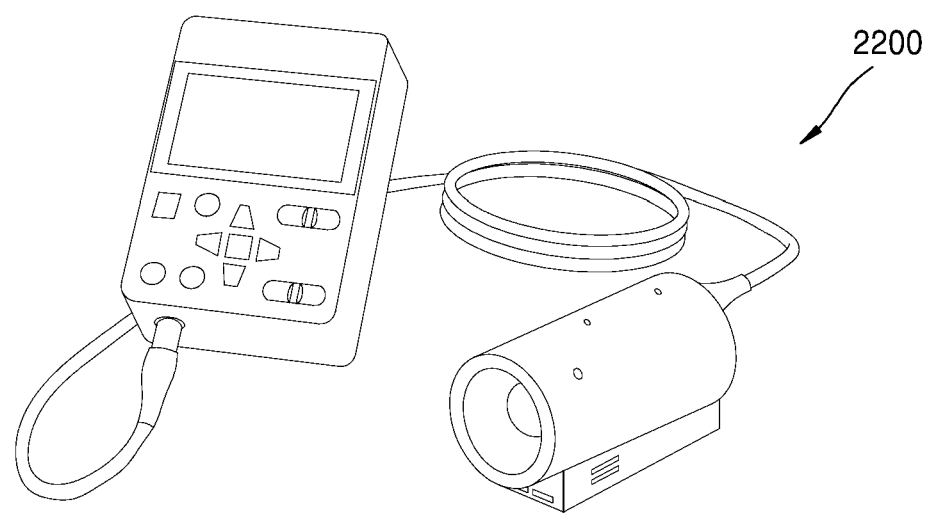

Also, the image sensor 1000 may be applied to a smart refrigerator 1900 shown in FIG. 19, a surveillance camera 2000 shown in FIG. 20, a robot 2100 shown in FIG. 21, a medical camera 2200 shown in FIG. 22, etc. For example, the smart refrigerator 1900 may automatically recognize food in the refrigerator by using the image sensor, and may notify the user of an existence of a certain kind of food, kinds of food put into or taken out, etc. through a smartphone. Also, the surveillance camera 2000 may provide an ultra-high-resolution image and may allow the user to recognize an object or a person in the image even in dark environment by using high sensitivity. The robot 2100 may be used at a disaster or industrial site that a person may not directly access, to provide the user with high-resolution images. The medical camera 2200 may provide high-resolution images for diagnosis or surgery, and may dynamically adjust a field of view.

Figure 23:
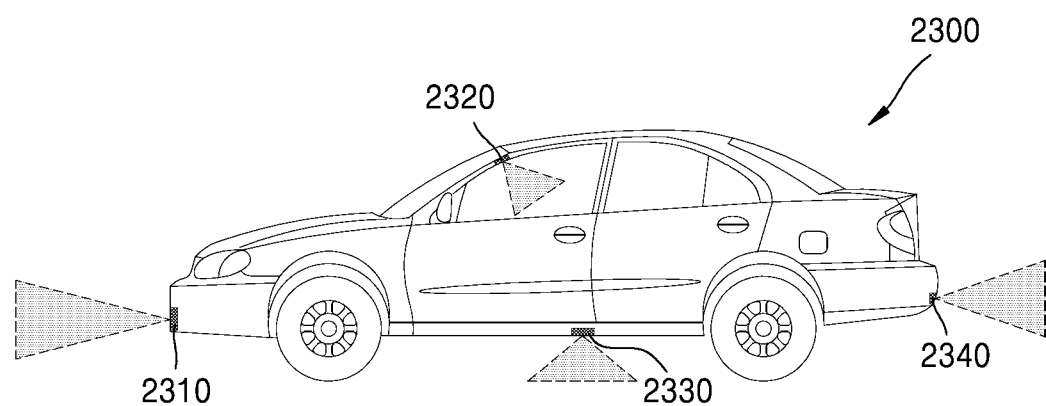

Also, the image sensor 1000 may be applied to a vehicle 2300 as shown in FIG. 23. The vehicle 2300 may include a plurality of vehicle cameras 2310, 2320, 2330, and 2340 at various locations. Each of the vehicle cameras 2310, 2320, 2330, and 2340 may include the image sensor according to the one or more embodiments. The vehicle 2300 may provide a driver with various information about the interior of the vehicle 2300 or the periphery of the vehicle 2300 by using the plurality of vehicle cameras 2310, 2320, 2330, and 2340, and may provide the driver with the information necessary for the autonomous travel by automatically recognizing an object or a person in the image.

It should be understood that example embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and their equivalents.

What is claimed is:

1. An image sensor comprising:
   a sensor substrate including a first pixel, configured to sense light of a first wavelength, and a second pixel configured to sense light of a second wavelength;
   a spacer layer on the sensor substrate, the spacer layer being transparent; and
   a color separating lens array on the spacer layer, the color separating lens array being configured to condense the light of the first wavelength incident on the color separating lens array toward the first pixel,
   wherein the color separating lens array includes a first lens layer on the spacer layer, a second lens layer on the first lens layer, and a first etch prevention layer between the first lens layer and the second lens layer,
   wherein the first lens layer comprises a first pixel region corresponding to the first pixel and a second pixel region corresponding to the second pixel, each of the first pixel region and the second pixel region comprising a plurality of first nanoposts and a first dielectric material layer provided between the plurality of first nanoposts, and
   wherein the first etch prevention layer is provided on upper surfaces of the plurality of first nanoposts and an upper surface of the first dielectric material layer.

2. The image sensor of claim 1,
   wherein the first etch prevention layer has a thickness of about 3 nm to about 30 nm.

3. The image sensor of claim 1,
   wherein the first etch prevention layer has a thickness of about 5 nm to about 15 nm.

4. The image sensor of claim 1,
   wherein the first etch prevention layer includes HfO2.

5. The image sensor of claim 1, further comprising an anti-reflection layer on the color separating lens array.

6. The image sensor of claim 5,
   wherein the anti-reflection layer includes a SiO2 layer.

7. The image sensor of claim 5,
   wherein the anti-reflection layer has a thickness of about 80 nm to about 120 nm.

8. The image sensor of claim 5,
   wherein the anti-reflection layer includes a first anti-reflection layer and a second anti-reflection layer, the first anti-reflection layer including a first material, and the second anti-reflection layer including a second material that is different from the first material.

9. The image sensor of claim 8,
   wherein the first material includes SiO2 and the second material includes Si3N4.

10. The image sensor of claim 8,
    wherein the second anti-reflection layer has a thickness of about 20 nm to about 60 nm.

11. The image sensor of claim 1, further comprising a second etch prevention layer between the spacer layer and the color separating lens array, wherein the second etch prevention layer is provided on an upper surface of the spacer layer, and wherein bottom surfaces of the plurality of first nanoposts and a bottom surface of the first dielectric material layer are provided on the second etch prevention layer.

12. The image sensor of claim 1,
wherein the second lens layer comprises a third pixel region corresponding to the first pixel and a fourth pixel region corresponding to the second pixel,
each of the third pixel region and the fourth pixel region comprising a plurality of second nanoposts and a second dielectric material layer provided between the plurality of second nanoposts, and
wherein bottom surfaces of the plurality of second nanoposts and a bottom surface of the second dielectric material are provided on the first etch prevention layer.

13. The image sensor of claim 1,
wherein the color separating lens array is further configured to condense the light of the second wavelength toward the second pixel.

14. An electronic apparatus comprising:
an image sensor configured to convert an optical image into an electrical signal; and
a processor configured to control operations of the image sensor and store and output a signal generated by the image sensor,
wherein the image sensor comprises:
a sensor substrate including a first pixel, configured to sense light of a first wavelength, and a second pixel configured to sense light of a second wavelength;
a spacer layer on the sensor substrate, the spacer layer being transparent; and
a color separating lens array on the spacer layer, the color separating lens array being configured to condense the light of the first wavelength incident on the color separating lens array toward the first pixel, and
wherein the color separating lens array includes a first lens layer on the spacer layer, a second lens layer on the first lens layer, and a first etch prevention layer between the first lens layer and the second lens layer,
wherein the first lens layer comprises a first pixel region corresponding to the first pixel and a second pixel region corresponding to the second pixel, each of the first pixel region and the second pixel region comprising a plurality of first nanoposts and a first dielectric material layer provided between the plurality of first nanoposts, and
wherein the first etch prevention layer is provided on upper surfaces of the plurality of first nanoposts and an upper surface of the first dielectric material layer.

15. The electronic apparatus of claim 14,
wherein the first etch prevention layer has a thickness of about 3 nm to about 30 nm.

16. The electronic apparatus of claim 14,
wherein the first etch prevention layer has a thickness of about 5 nm to about 15 nm.

17. The electronic apparatus of claim 14,
wherein the first etch prevention layer includes HfO2.

18. The electronic apparatus of claim 14, further comprising an anti-reflection layer on the color separating lens array.

19. The electronic apparatus of claim 18,
wherein the anti-reflection layer includes a SiO2 layer.

20. The electronic apparatus of claim 18,
wherein the anti-reflection layer has a thickness of about 80 nm to about 120 nm.

21. The electronic apparatus of claim 18,
wherein the anti-reflection layer includes a first anti-reflection layer and a second anti-reflection layer, the first anti-reflection layer including a first material, and the second anti-reflection layer including a second material that is different from the first material.

22. The electronic apparatus of claim 21,
wherein the first material includes SiO2 and the second material includes Si3N4.

23. The electronic apparatus of claim 21,
wherein the second anti-reflection layer has a thickness of about 20 nm to about 60 nm.

24. The electronic apparatus of claim 14, further comprising a second etch prevention layer between the spacer layer and the color separating lens array,
wherein the second etch prevention layer is provided on an upper surface of the spacer layer, and
wherein bottom surfaces of the plurality of first nanoposts and a bottom surface of the first dielectric material layer are provided on the second etch prevention layer.

25. The electronic apparatus of claim 14,
wherein the second lens layer comprises a third pixel region corresponding to the first pixel and a fourth pixel region corresponding to the second pixel,
each of the third pixel region and the fourth pixel region comprising a plurality of second nanoposts and a second dielectric material layer provided between the plurality of second nanoposts, and
wherein bottom surfaces of the plurality of second nanoposts and a bottom surface of the second dielectric material are provided on the first etch prevention layer.

26. The electronic apparatus of claim 14,
wherein the color separating lens array is further configured to condense the light of the second wavelength toward the second pixel.

* * * * *